United States Patent
Kim et al.

(10) Patent No.: US 11,462,292 B1
(45) Date of Patent: Oct. 4, 2022

(54) ERROR CORRECTION CIRCUIT OF SEMICONDUCTOR MEMORY DEVICE AND SEMICONDUCTOR MEMORY DEVICE INCLUDING THE SAME

(71) Applicant: Samsung Electronics Co., Ltd., Suwon-si (KR)

(72) Inventors: Kiheung Kim, Suwon-si (KR); Sanguhn Cha, Suwon-si (KR); Sungrae Kim, Seoul (KR); Sunghye Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 17/227,582

(22) Filed: Apr. 12, 2021

(51) Int. Cl.
| | |
|---|---|
| *G11C 29/42* | (2006.01) |
| *G11C 29/44* | (2006.01) |
| *G11C 29/18* | (2006.01) |
| *H03M 13/11* | (2006.01) |
| *H03M 13/15* | (2006.01) |
| *G11C 29/12* | (2006.01) |

(52) U.S. Cl.
CPC .............. *G11C 29/42* (2013.01); *G11C 29/18* (2013.01); *G11C 29/44* (2013.01); *H03M 13/1168* (2013.01); *H03M 13/1575* (2013.01); *G11C 2029/1202* (2013.01); *G11C 2029/1204* (2013.01)

(58) Field of Classification Search
CPC ......... G11C 29/42; G11C 29/18; G11C 29/44; H03M 13/1168; H03M 13/1575
See application file for complete search history.

(56) References Cited

U.S. PATENT DOCUMENTS

| | | | |
|---|---|---|---|
| 6,018,817 A | 1/2000 | Chen et al. | |
| 6,367,046 B1* | 4/2002 | Chapman | H03M 13/27 714/752 |
| 6,453,440 B1 | 9/2002 | Cypher | |
| 6,473,880 B1 | 10/2002 | Cypher | |
| 6,477,682 B2 | 11/2002 | Cypher | |
| 6,604,222 B1 | 8/2003 | Jensen | |
| 7,080,305 B2* | 7/2006 | Welbon | H03M 13/35 714/752 |
| 7,116,600 B2 | 10/2006 | Choi | |
| 7,440,336 B2 | 10/2008 | Choi | |

(Continued)

FOREIGN PATENT DOCUMENTS

KR 101573566 B1 12/2015

*Primary Examiner* — Tuan T Nguyen
(74) *Attorney, Agent, or Firm* — Muir Patent Law, PLLC

(57) ABSTRACT

An error correction circuit includes ECC encoder and an ECC decoder. The ECC encoder generates, based on a first main data obtained by selectively shifting data bits of a main data based on a LSB of a row address, a parity data using an ECC and stores a codeword including the main data and the parity data in a target page. The ECC decoder generates a syndrome based on a second main data obtained by selectively shifting data bits of the main data based on the LSB of the row address, the parity data and a parity check matrix based on the ECC, and corrects a single bit error or corrects two bit errors when the two bit errors occur in adjacent two memory cells based on the syndrome. The mis-corrected bit is generated when the multiple error bits are present in the main data.

20 Claims, 33 Drawing Sheets

(56) References Cited

U.S. PATENT DOCUMENTS

| | | | | |
|---|---|---|---|---|
| 8,230,305 B2* | 7/2012 | Resnick | ................ | H03M 13/19 |
| | | | | 714/777 |
| 8,566,677 B2 | 10/2013 | Resnick | | |
| 9,071,273 B2 | 6/2015 | Resnick | | |
| 9,563,502 B1* | 2/2017 | Alhussien | ........... | G11C 11/5642 |
| 10,734,087 B2* | 8/2020 | Cohen | .................... | G11C 16/28 |
| 2017/0125114 A1* | 5/2017 | Alhussien | .............. | G11C 16/28 |
| 2021/0357154 A1* | 11/2021 | Song | .................... | G06F 9/3004 |
| 2022/0208252 A1* | 6/2022 | Kim | .................... | G11C 11/4091 |

* cited by examiner

FIG. 12A

CINX: 0 1 2 3 4 5 6 7

CINX: 0 1 2 3 4 5 6 7

PRT

| d129 | | | | | | | d136 |
|---|---|---|---|---|---|---|---|
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

PV1 PV2 ... PV8

PCG

| BTL | 0 | 1 | 2 | 3 | 4 | 5 | 6 | 7 |
|---|---|---|---|---|---|---|---|---|
| WLe | ◯ |  | ◯ |  | ◯ |  | ◯ |  |
| WLo |  | ◯ |  | ◯ |  | ◯ |  | ◯ |

: C2C ERROR

FIG. 21A

| MD | | | | | | | | |
|---|---|---|---|---|---|---|---|---|
| RWDIO | 0 | 1 | 2 | 3 | 4 | 5 | 6 | 7 |
| WLe | 0 | 1 | 2 | 3 | 4 | 5 | 6 | 7 |
| WLo | 0 | 1 | 2 | 3 | 4 | 5 | 6 | 7 |

| 8 | 9 | 10 | 11 | 12 | 13 | 14 | 15 |
|---|---|---|---|---|---|---|---|
| 8 | 9 | 10 | 11 | 12 | 13 | 14 | 15 |
| 8 | 9 | 10 | 11 | 12 | 13 | 14 | 15 |

| ERR | 0 | 1 | 2 | 3 | 4 | 5 | 6 | 7 |
|---|---|---|---|---|---|---|---|---|
| WLe | 0 | 1 | 2 | 3 | 4 | 5 | 6 | 7 |
| WLo | 0 | 1 | 2 | 3 | 4 | 5 | 6 | 7 |

| 8 | 9 | 10 | 11 | 12 | 13 | 14 | 15 |
|---|---|---|---|---|---|---|---|
| 8 | 9 | 10 | 11 | 12 | 13 | 14 | 15 |
| 8 | 9 | 10 | 11 | 12 | 13 | 14 | 15 |

ERROR CORRECTION CIRCUIT OF SEMICONDUCTOR MEMORY DEVICE AND SEMICONDUCTOR MEMORY DEVICE INCLUDING THE SAME

TECHNICAL FIELD

Example embodiments of the present disclosure relate to memory devices. More particularly, example embodiments of the present disclosure relate to error correction circuits of semiconductor memory devices.

BACKGROUND OF THE INVENTION

Semiconductor memory devices may be classified as non-volatile memory devices, such as flash memory devices, and volatile memory devices, such as dynamic random access memory (DRAM) devices. DRAM devices are often used for system memories due to their high speed operation and cost efficiency. Due to the continuing reduction in fabrication design rules of DRAM devices, bit errors of memory cells in DRAM devices may increase, and the yield of DRAM devices may decrease. Thus, the technology to correct bit errors of memory cells may become important.

SUMMARY

Some example embodiments provide an error correction circuit of a semiconductor memory device, capable of enhancing performance and reliability.

Some example embodiments provide a semiconductor memory device with enhanced performance and reliability.

According to some example embodiments, an error correction circuit of a semiconductor memory device includes an error correction code (ECC) encoder and an ECC decoder. The ECC encoder generates, based on a first main data obtained by selectively shifting data bits of a main data based on a least significant bit (LSB) of a row address, a parity data using an ECC represented by a generation matrix and stores a codeword including the main data and the parity data in a target page of a memory cell array. The ECC decoder reads the main data and the parity data from the target page, generates a syndrome based on a second main data obtained by selectively shifting data bits of the main data based on the LSB of the row address, the parity data and a parity check matrix based on the ECC, and corrects a single bit error when the single bit error exists in the main data or to corrects two bit errors when the two bit errors occur in adjacent two memory cells in the target page based on the syndrome. Data bits of the main data are divided into a plurality of sub data units. The ECC includes a plurality of column vectors divided into a plurality of code groups corresponding to respective ones of the plurality of sub data units, the plurality of column vectors have elements configured to gather a mis-corrected bit and multiple error bits in one symbol and the mis-corrected bit is generated when the multiple error bits are present in the main data.

According to some example embodiments, a semiconductor memory device includes a memory cell array and an error correction circuit. The memory cell array includes a plurality of volatile memory cells connected to word-lines and bit-lines. The error correction circuit generates a parity data based on a main data and an error correction code (ECC) and stores a codeword including the main data and the parity data in a target page of the memory cell array based on an access address receiving from an external device. The error correction circuit reads the codeword from the target page, generates a syndrome based on a parity check matrix based on the ECC, and corrects a single bit error when the single bit error exists in the main data or corrects two bit errors when the two bit errors occur in adjacent two memory cells in the target page based on the syndrome. Data bits of the main data are divided into a plurality of sub data units. The ECC includes a plurality of column vectors divided into a plurality of code groups corresponding to respective ones of the plurality of sub data units, the plurality of column vectors have elements configured to gather a mis-corrected bit and multiple error bits in one symbol and the mis-corrected bit is generated when the multiple error bits are present in the main data.

According to some example embodiments, a semiconductor memory device includes a memory cell array, an error correction circuit and a control logic circuit. The memory cell array includes a plurality of volatile memory cells connected to word-lines and bit-lines. The error correction circuit generates a parity data based on a main data and an error correction code (ECC) and stores a codeword including the main data and the parity data in a target page of the memory cell array based on an access address receiving from an external device. The error correction circuit reads the codeword from the target page, generates a syndrome based on a parity check matrix based on the ECC, and corrects a single bit error when the single bit error exists in the main data or corrects two bit errors when the two bit errors occur in adjacent two memory cells in the target page based on the syndrome. The control logic circuit controls the error correction circuit based on the access address and a command receiving from the external device. The error correction circuit includes an ECC encoder and an ECC decoder. The ECC encoder generates, based on a first main data obtained by selectively shifting data bits of the main data based on a least significant bit (LSB) of a row address of the access address, the parity data using the ECC. The ECC decoder reads the main data and the parity data from the target page, generates the syndrome based on a second main data obtained by selectively shifting data bits of the main data based on the LSB of the row address, the parity data and the parity check matrix, and corrects the single bit error or the two bit errors based on the syndrome. The data bits are divided into a plurality of sub data units. The ECC includes a plurality of column vectors divided into a plurality of code groups corresponding to respective ones of the plurality of sub data units, the plurality of column vectors have elements configured to gather a mis-corrected bit and multiple error bits in one symbol and the mis-corrected bit is generated when the multiple error bits are present in the main data.

According to some example embodiments, the error correction circuit and the semiconductor memory device including the error correction circuit may correct the single bit error and the adjacent two bit errors by using the parity check matrix which is based on the ECC, may gather a mis-corrected bit and multiple error bits in one symbol or may render a column vector corresponding to the mis-corrected bit does not belong to the parity check matrix. Therefore, the error correction circuit and the semiconductor memory device including the error correction circuit may increase efficiency of error correcting and may enhance performance.

BRIEF DESCRIPTION OF THE DRAWINGS

The above and other features of the present disclosure will become more apparent by describing in detail example embodiments thereof with reference to the accompanying drawings.

FIGS. 12A, 12B, 12C and 12D illustrate examples of error bit in data pattern stored in a sub array block according to a LSB of the row address, respectively.

FIGS. 18A through 18E illustrate examples of the parity check matrix of FIG. 17.

FIGS. 21A through 21C illustrate examples in which the main data and the parity data are selectively shifted in the error correction circuit of FIG. 11 based on whether a word-line designated bay a row address is an even word-line or an odd word-line, according to some example embodiments.

DETAILED DESCRIPTION OF THE EMBODIMENTS

Figure 1:
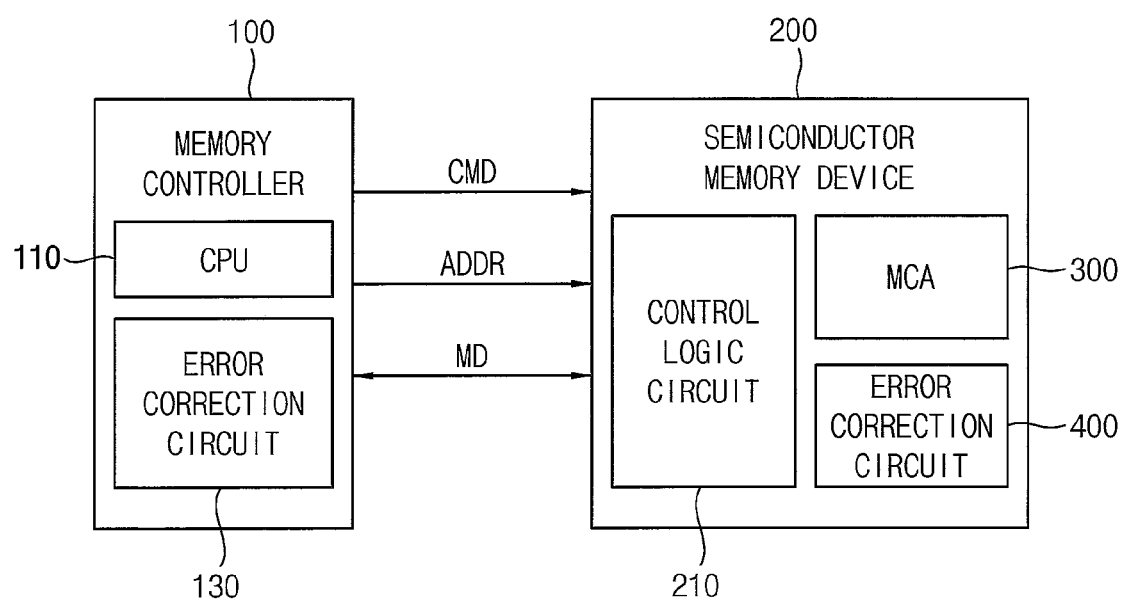
FIG. 1 is a block diagram illustrating a memory system according to example embodiments.

Example embodiments of the present disclosure will be described more fully hereinafter with reference to the accompanying drawings. Like reference numerals may refer to like elements throughout the accompanying drawings.

FIG. 1 is a block diagram illustrating a memory system according to example embodiments.

Referring to FIG. 1, a memory system 20 may include a memory controller 100 (e.g., an external memory controller) and a (at least one) semiconductor memory device 200. The memory controller 100 may be an integrated circuit formed in a semiconductor chip (also referred to herein as a "die"). The semiconductor memory device 200 may be formed as a semiconductor chip.

The memory controller 100 may control the overall operation of the memory system 20. The memory controller 100 may control the overall data exchange between an external host (not shown) and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

In example embodiments, the semiconductor memory device 200 is a memory device including a plurality of dynamic (volatile) memory cells such as a dynamic random access memory (DRAM), DDR5 (double data rate) synchronous DRAM (SDRAM), DDR6 (double data rate) synchronous DRAM (SDRAM) or a stacked memory device. An example of a stacked memory device in some embodiments is a high bandwidth memory (HBM).

The memory controller 100 transmits a command CMD, and an address (signal) ADDR to the semiconductor memory device 200 and exchanges main data MD with the semiconductor memory device 200.

The memory controller 100 may include a central processing unit (CPU) 110 and an error correction circuit 130. As explained below, the semiconductor memory device 200 may include an error correction circuit 400, so the error correction circuit 400 may be referred to as a first error correction circuit and the error correction circuit 130 in the memory controller 100 may be referred to as a second error correction circuit.

The CPU 110 may control overall operation of the memory controller 100. The error correction circuit 130 may generate, based on the main data MD to be transmitted to the semiconductor memory device 200, a parity data. The error correction circuit 130 may store the parity data, may generate check bits based on the main data MD when the main data MD is received from the semiconductor memory device 200 and may correct error bits in the main data MD received from the semiconductor memory device 200 based on a comparison of the parity data and the check bits.

The semiconductor memory device 200 includes a memory cell array (MCA) 300 that stores the main data MD, the error correction circuit 400 and a control logic circuit 210. The memory cell array 300 includes a plurality of sub array blocks arranged in a first direction and a second direction crossing the first direction as will be described with reference to FIG. 7.

A generation matrix may represent the ECC as a structure/data format in a matrix form. The generation matrix may include, for example, a plurality of column vectors, and the column vectors may be divided into groups. The error correction circuit 400 may generate a parity data using an ECC which is represented by the generation matrix. The groups of column vectors of the generation matrix may include, for example, a plurality of code groups corresponding to sub data units of the main data MD and the parity data. The error correction circuit 400 may generate the parity data by performing an ECC encoding on the main data MD and may detect and/or correct at least one error bit in the main data MD read from the memory cell array 300 using the parity data by performing an ECC decoding on the main data MD.

The error correction circuit 400 may include an ECC decoder. The ECC decoder in the error correction circuit 400 may be configured to read data (e.g., a codeword) from a target page in the memory cell array 300. The ECC decoder in the error correction circuit 400 may be configured to read the codeword from the target page in the memory cell array 300 based on an address provided from outside the semiconductor memory device 200 to generate at least one syndrome. A syndrome is an indication of whether an error occurs in a read codeword, and conventionally this is shown when a syndrome calculation results in a non-zero result showing a difference between, for example, the original main data MD in a codeword to be stored and the main data MD in the read codeword. The ECC decoder may generate a syndrome by applying a parity check matrix to data (e.g., the codeword) read from the memory cell array 300, may generate a sum parity check matrix based on the parity check matrix, may correct a single bit error in the read data when the single bit error exists in the read data based on the syndrome and the parity check matrix and may correct two bit errors occurring in adjacent two memory cells in a target page when the two bit errors occur in the adjacent two memory cells in the target page based on the syndrome and the sub parity check matrix. The parity check matrix is explained in detail later with respect to, for example, FIGS. 18A through 18E. The sub parity check matrix is explained in detail later with respect to, for example, FIGS. 19A through 19D.

The main data MD includes a plurality of data bits, and the plurality of data bits may be divided into a plurality of sub data units.

The ECC may include a plurality of column vectors divided into a plurality of code groups corresponding to the sub data units and the parity data. The plurality of column vectors may have elements to gather a mis-corrected bit and multiple error bits in one symbol and the mis-corrected bit may be generated when the multiple error bits are present in the main data. The one symbol may include two adjacent sub data units of the sub data units. The column vectors may have elements to place the mis-corrected bit in sub data units corresponding to the one symbol or have elements such that a column vector corresponding to the mis-corrected bit is not the same as each of the column vectors.

The semiconductor memory device 200 may perform a burst operation. Herein, the burst operation refers to an operation of writing or reading a large amount of data by sequentially increasing or decreasing an initial address provided from the memory controller 100. A basic unit of the burst operation may be referred to as a burst length BL. In example embodiments, the burst length BL refers to the number of operations of continuously reading or writing data by sequentially increasing or decreasing an initial address. The main data MD in the memory system 20 of FIG. 1 may correspond to multiple burst lengths.

Figure 2:
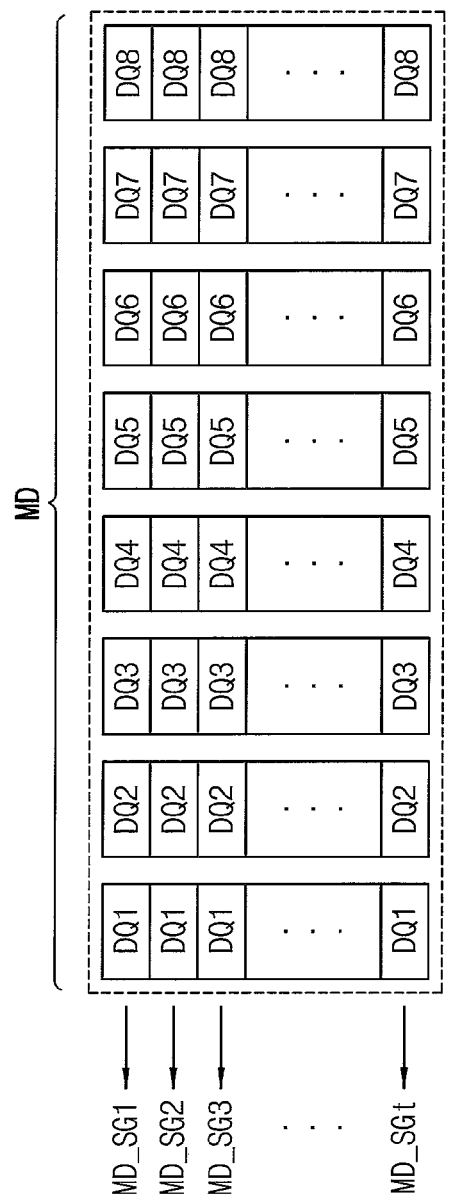
FIG. 2 illustrates a main data corresponding to the plurality of burst lengths in the memory system of FIG. 1 according to some example embodiments.

FIG. 2 illustrates a main data corresponding to the plurality of burst lengths in the memory system of FIG. 1 according to some example embodiments.

Referring to FIG. 2, the main data MD corresponding to the plurality of burst lengths are input to/output from the semiconductor memory device 200. The main data MD includes data segments MD_SG1~MD_SGt (t is a natural number equal to or greater than 8) each corresponding to a burst length among the plurality of burst lengths. The burst length is assumed to be 8 in FIG. 2. However, example embodiments are not limited thereto. The main data MD corresponding to the plurality of burst lengths may be stored in the memory cell array 300 of the semiconductor memory device 200.

Figure 3:
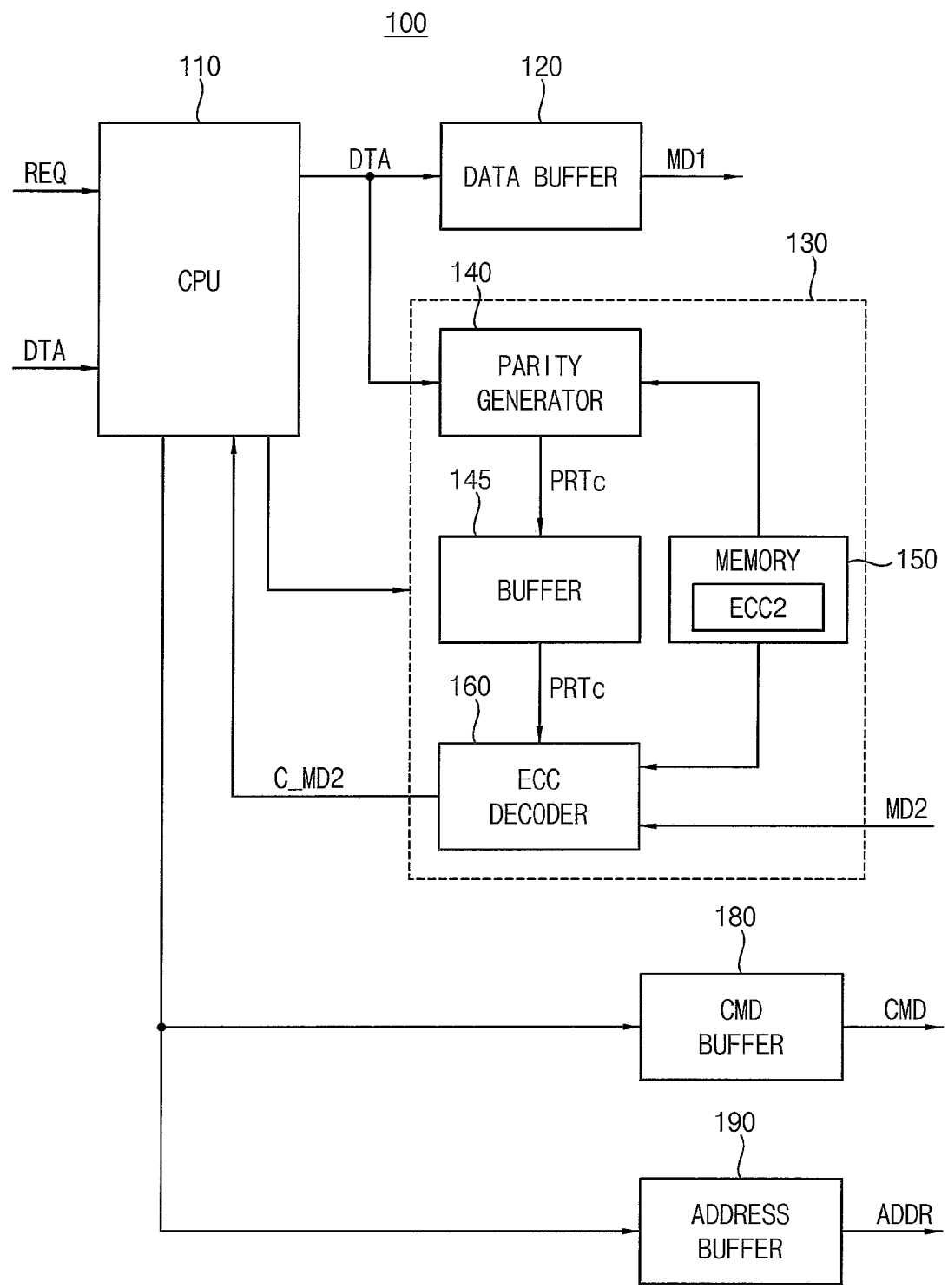
FIG. 3 is a block diagram illustrating an example of the memory controller in FIG. 1 according to some example embodiments.

FIG. 3 is a block diagram illustrating an example of the memory controller in FIG. 1 according to some example embodiments.

Referring to FIG. 3, the memory controller 100 may include a CPU (central processing unit) 110, a data buffer 120, the error correction circuit 130, a command buffer 180 and an address buffer 190. The error correction circuit 130 may include a parity generator 140, a buffer 145, an ECC memory 150 that stores a second ECC ECC2, and an ECC decoder 160.

The CPU 110 may control the data buffer 120, the error correction circuit 130, the command buffer 180 and the address buffer 190.

The CPU 110 receives a request REQ and a data DTA from the host, and provides the data DTA to the data buffer 120 and the parity generator 140.

The data buffer 120 buffers the data DTA to provide a first main data MD1 to the semiconductor memory device 200.

The parity generator 140 is connected to the ECC memory 150, performs an ECC encoding on the data DTA using the second ECC ECC2 to generate a system parity data PRTc and stores the system parity data PRTc in the buffer 145.

The ECC decoder 160, in a read operation of the semiconductor memory device 200, receives a second main data MD2 from the semiconductor memory device 200. The ECC decoder 160 performs an ECC decoding on the second main data MD2 by using the second ECC ECC2 and the system parity data PRTc and may provide a corrected main data C_MD2 to the CPU 110. The CPU 110 provides the corrected main data C_MD2 to the host.

The command buffer 180 stores the command CMD corresponding to the request REQ and transmits the command CMD to the semiconductor memory device 200 under control of the CPU 110. The address buffer 190 stores the address ADDR and transmits the address ADDR to the semiconductor memory device 200 under control of the CPU 110.

Figure 4:
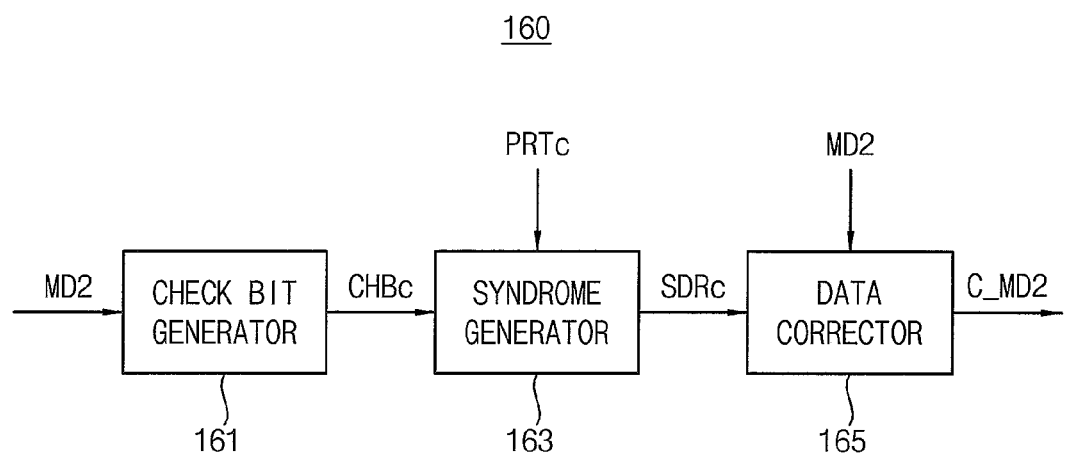
FIG. 4 is a block diagram illustrating an example of the ECC decoder in FIG. 3 according to some example embodiments.

FIG. 4 is a block diagram illustrating an example of the ECC decoder in FIG. 3 according to some example embodiments.

Referring to FIG. 4, the ECC decoder 160 may include a check bit generator 161, a syndrome generator 163 and a data corrector 165.

The check bit generator 161 receives the second main data MD2 read from the semiconductor memory device 200, and generates check bits CHBc corresponding to the second main data MD2 using the second ECC ECC2.

The syndrome generator 163 compares the system parity data PRTc and the check bits CHBc based on symbols to generate a syndrome data SDRc. The syndrome data SDRc indicates whether the second main data MD2 includes at least one error bit as well as a position of the at least one error bit.

The data corrector 165 receives the second main data MD2 and corrects the at least one error bit in the second main data MD2 based on the syndrome data SDRc to output the corrected main data C_MD2.

Figure 5:
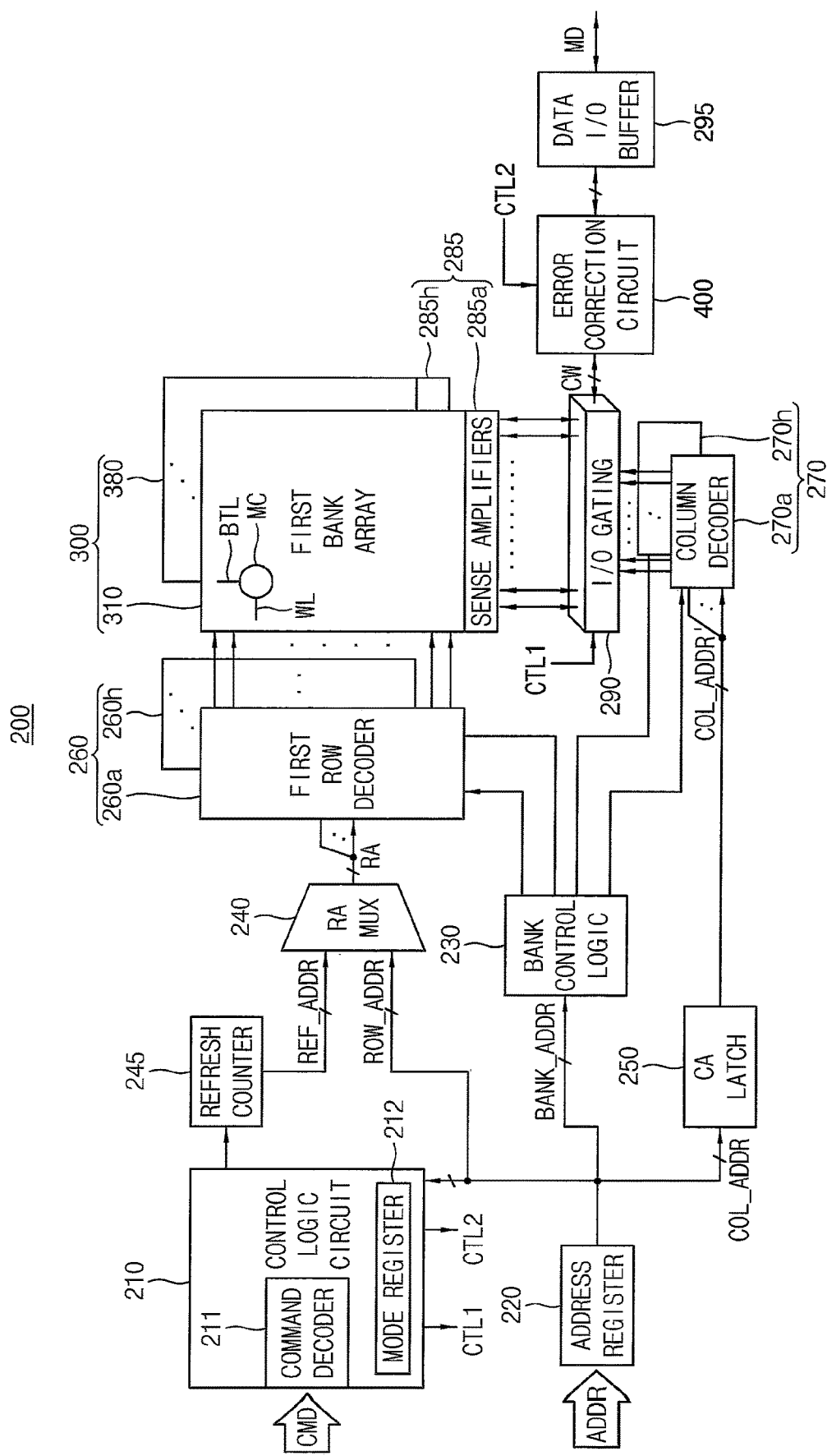
FIG. 5 is a block diagram illustrating the semiconductor memory device in FIG. 1 according to some example embodiments.

FIG. 5 is a block diagram illustrating the semiconductor memory device in FIG. 1 according to some example embodiments.

Referring to FIG. 5, the semiconductor memory device 200 may include a control logic circuit 210, an address register 220, a bank control logic 230, a row address multiplexer 240, a column address latch 250, a row decoder 260, a column decoder 270, a memory cell array 300, a sense amplifier unit 285, an I/O gating circuit 290 (input/output gating circuit), a data I/O buffer 295 (data input/output buffer), a refresh counter 245, and an error correction circuit 400.

The memory cell array 300 may include first through eighth bank arrays 310~380. The row decoder 260 may include first through eighth bank row decoders 260a~260h respectively coupled to the first through eighth bank arrays 310~380. The column decoder 270 may include first through eighth bank column decoders 270a~270h respectively coupled to the first through eighth bank arrays 310~380. The sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. In addition, each of the first through eighth bank arrays 310~380 may be divided into a plurality of sub array blocks arranged in a first direction and a second direction such as a horizontal direction and a vertical direction or such as a depth direction and a vertical direction.

Each of the first through eighth bank arrays 310~380 includes a plurality of memory cells MC coupled to word-lines WL and bit-lines BTL.

Although the semiconductor memory device 200 is illustrated in FIG. 5 as including eight banks, example embodiments of the present disclosure are not limited thereto, and the semiconductor memory device 200 may include any number of banks.

The control logic circuit 210 receives a command CMD from the memory controller 100. The address register 220 receives an address ADDR including a bank address BANK_ADDR, a row address ROW_ADDR and a column address COL_ADDR from the memory controller 100.

The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF ADDR from the refresh counter 245. The row address multiplexer 240 may selectively output one of the row address ROW_ADDR and the refresh row address REF ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In example embodiments, in a burst mode, the column address latch 250 may generate column addresses COL_ADDR' that increment from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR' that is output from the column address latch 250, and may control the I/O gating circuit 290 to output data corresponding to the column address COL_ADDR' received from the column address latch 250. The activated one of the first through eighth bank column decoders 270a~270h may alternatively control the I/O gating circuit 290 to output data corresponding to a mapped column address MCA.

The I/O gating circuit 290 may include circuitry for gating input/output data. The I/O gating circuit 290 may further include read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the codeword is to be read, and may be stored in the read data latches. The codeword CW stored in the read data latches is ECC-decoded by the error correction circuit 400 and may be provided to the memory controller 100 via the data I/O buffer 295.

Data (or the main data) MD to be written in one bank array of the first through eighth bank arrays 310~380 may be provided to the data I/O buffer 295 from the memory controller 100. The main data MD is provided to the error correction circuit 400.

The error correction circuit 400 performs ECC encoding on the main data MD to generate a parity data, and provides the I/O gating circuit 290 with the codeword CW including the main data MD and the parity data. The control logic circuit 210 is configured to control the I/O gating circuit 290 such that the sub data units of the main data MD and the parity data are stored in target sub array blocks among the sub array blocks. The I/O gating circuit 290 may store the main data MD and the parity data in a target page based on a first control signal CTL1 from the control logic circuit 210. In addition, the error correction circuit 400 may perform ECC decoding on the main data read from the target page based on the parity data read from the target page.

When the error correction circuit 400 performs the ECC encoding and the ECC decoding, the error correction circuit 400 may use a first ECC ECC1 which is represented by a generation matrix. For example, the data structure/data format of the first ECC ECC1 may be a generation matrix. The first ECC ECC1 may include a plurality of column vectors corresponding to data bits of the data (or main data) MD and parity bits of the parity data, and the column vectors may be divided into a plurality of code groups corresponding to a plurality of sub data units and the parity data. The data bits of the main data MD and parity bits of the parity data may be divided into the plurality of sub data units. The first ECC ECC1 will be described in detail with reference to FIG. 11.

The error correction circuit 400 may read the codeword CW from the target page to generate a syndrome by applying a parity check matrix based on the first ECC ECC1 to the read codeword, and may generate a sub parity check matrix based on the parity check matrix. The error correction circuit 400 may correct a single bit error in the read codeword or correct two bit errors in the read codeword, when two bit errors in the read codeword occur in adjacent two memory cells in the target page, based on the syndrome and the sub parity check matrix. Therefore, the error correction circuit 400 may correct the single bit error or two bit errors in adjacent two memory cells in the main data MD.

The control logic circuit 210 may control operations of the semiconductor memory device 200. For example, the control logic circuit 210 may generate control signals for the semiconductor memory device 200 to perform a write operation or a read operation. The control logic circuit 210 may include a command decoder 211 that decodes the command CMD received from the memory controller 100, and a mode register 212 that sets an operation mode of the semiconductor memory device 200. That is, the control logic circuit 210 is configured to control the semiconductor memory device 200 based on the command CMD and the address received from outside the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290 and a second control signal CTL2 to control the error correction circuit 400.

Figure 6:
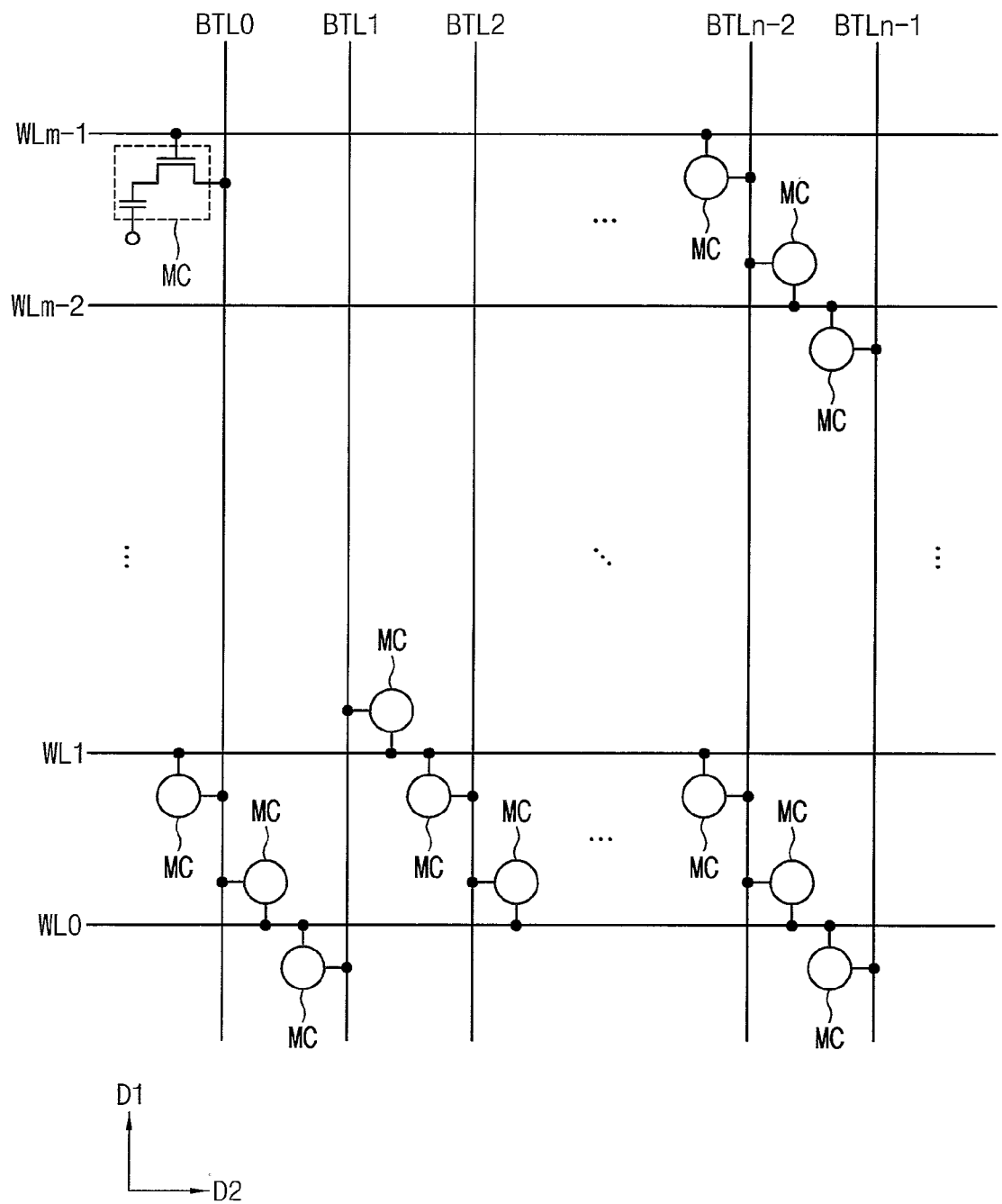
FIG. 6 illustrates an example of the first bank array in the semiconductor memory device of FIG. 5 according to some example embodiments.

FIG. 6 illustrates an example of the first bank array in the semiconductor memory device of FIG. 5 according to some example embodiments.

Referring to FIG. 6, the first bank array 310 includes a plurality of word-lines WL0~WLm-1 (where m is an even number equal to or greater than two), a plurality of bit-lines BTL0~BTLn-1 (where n is an even number equal to or greater than two), and a plurality of memory cells MCs disposed at intersections between the word-lines WL0~WLm-1 and the bit-lines BTL0~BTLn-1. Each of the memory cells MCs includes an access (cell) transistor coupled to one of the word-lines WL0~WLm-1 and one of the bit-lines BTL0~BTLn-1 and a storage (cell) capacitor coupled to the cell transistor. For example, each of the memory cells MCs includes a DRAM cell.

In addition, the memory cells MCs may have different arrangement depending on that the memory cells MCs are coupled to an even word-line (for example, WL0) or an odd word-line (for example, WL1). For example, a bit-line coupled to adjacent memory cells may be different depending on whether a word-line selected by an access address is an even word-line or an odd word-line. In addition, when an error occurs in a first memory cell, a probability that an error occurs in a second memory cell adjacent to the first memory cell may increase due to cell arrangement.

Figure 7:
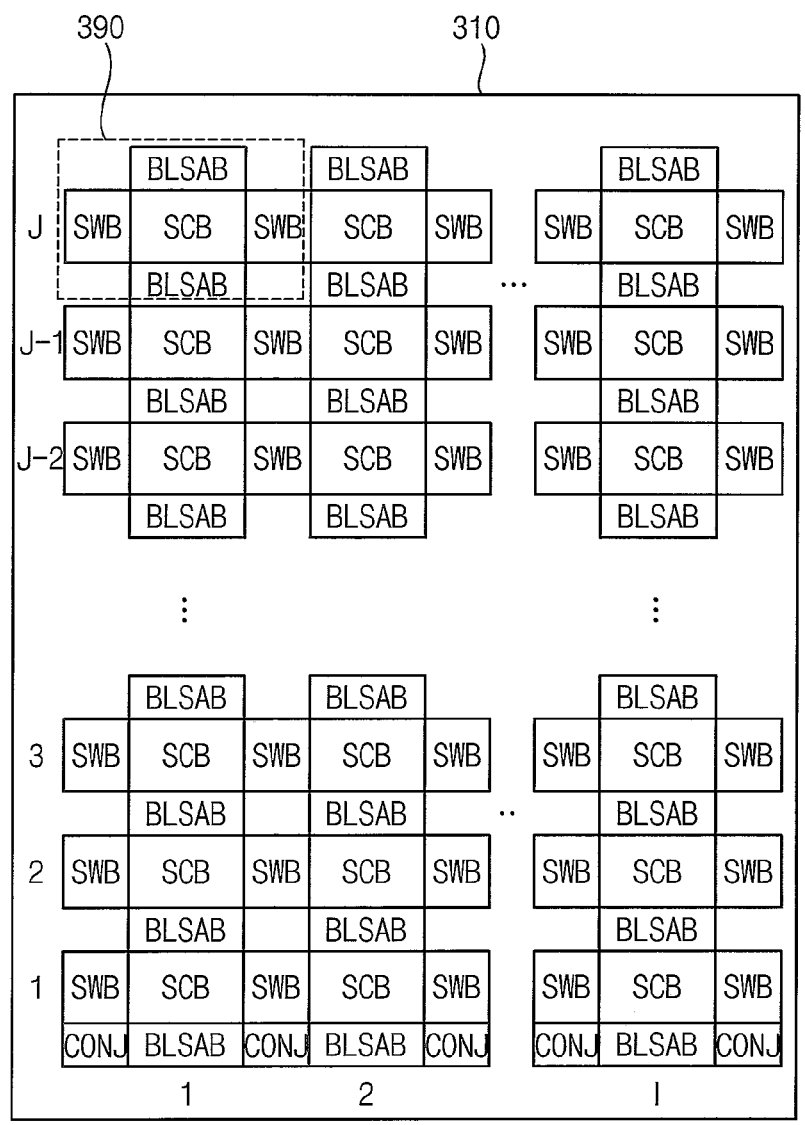
FIG. 7 illustrates an example of the first bank array in the semiconductor memory device of FIG. 5 according to some example embodiments.
Figure 7:

FIG. 7 illustrates an example of the first bank array in the semiconductor memory device of FIG. 5 according to some example embodiments.

Referring to FIG. 7, in the first bank array 310, I sub-array blocks SCB may be disposed in the second direction D2, and J sub-array blocks SCB may be disposed in the first direction D1 perpendicular to the second direction D2. I and J represent a number of the sub-array blocks SCB in the second direction and the first direction, respectively, and are natural numbers greater than two.

I sub-array blocks SCB disposed in the second direction D2 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the second direction D2 as well on each side of each of the sub-array blocks SCB in the second direction D2. Sub word-line drivers may be disposed in the sub word-line driver regions SWB. J+1 bit-line sense amplifier regions BLSAB may be disposed, for example, between the sub-array blocks SCB in the first direction D1 and above and below each of the sub-array blocks SCB in the first direction D1. Bit-line sense amplifiers to sense data stored in the memory cells may be disposed in the bit-line sense amplifier regions BLSAB.

Each of the plurality of sub data units may be stored in each of the sub-array blocks SCB disposed in the second direction D2.

A plurality of sub word-line drivers may be provided in each of the sub word-line driver regions SWB. One sub word-line driver region SWB may be associated with two sub-array blocks SCB adjacent to the sub word-line driver region SWB in the second direction D2.

When at least one of sub word-lines drivers provided in the one sub word-line driver region SWB operates abnormally, multiple errors including two or more bit errors may occur in adjacent two sub data units. The error correction circuit 400 assigns adjacent two sub data units to one symbol and the column vectors of the parity check matrix may have elements to gather multiple error bits and a mis-corrected bit generated due to the multiple error bits in one symbol.

A plurality of conjunction regions CONJ may be disposed adjacent the sub word-line driver regions SWB and the bit-line sense amplifier regions BLSAB. A voltage generator is disposed in each of the conjunction regions CONJ. A portion 390 in the first bank array 310 will be described with reference to FIG. 8 below.

Figure 8:
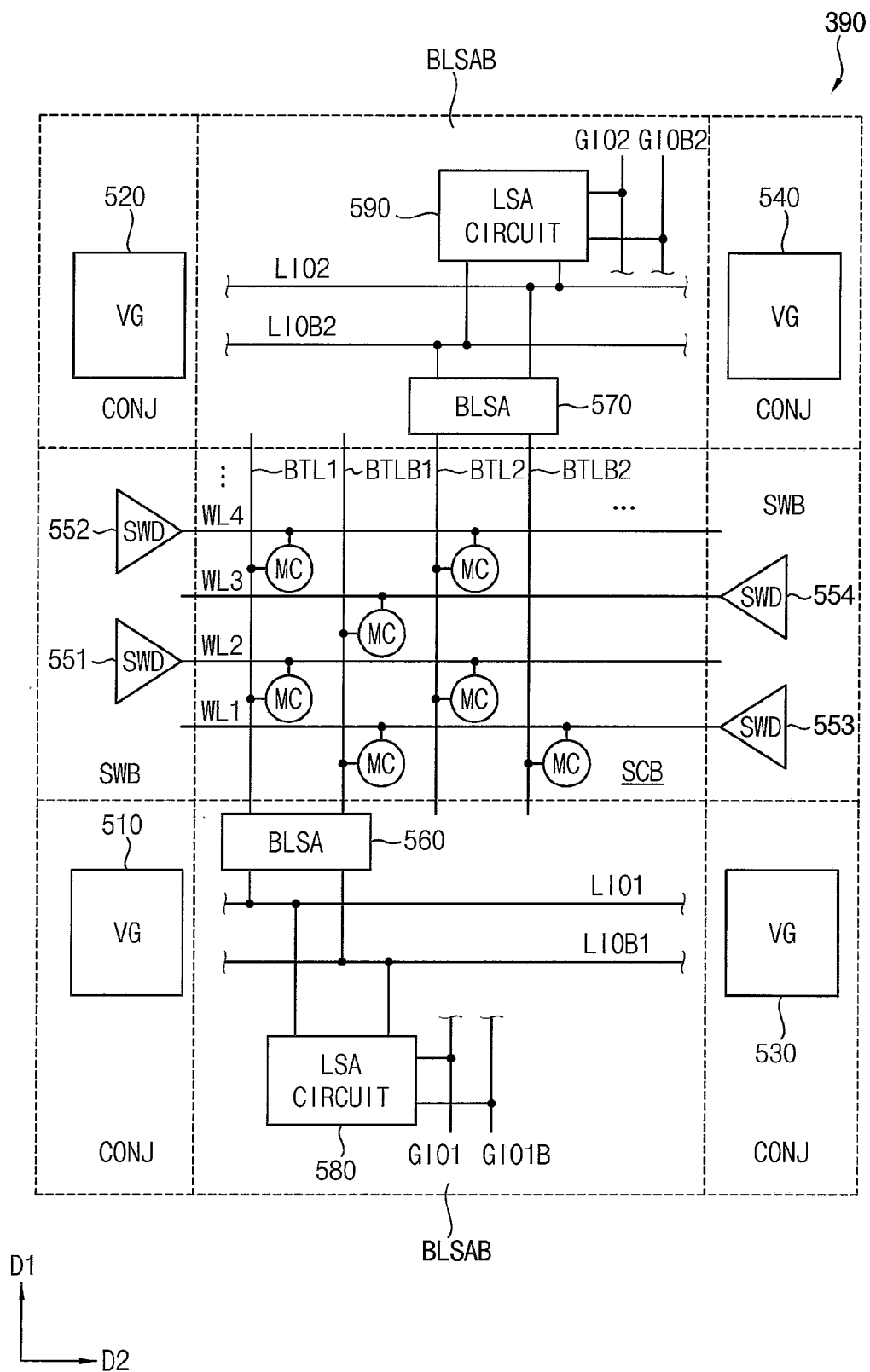
FIG. 8 illustrates a portion of the first bank array in FIG. 7 according to some example embodiments.

FIG. 8 illustrates a portion of the first bank array in FIG. 7 according to some example embodiments.

Referring to FIGS. 7 and 8, in the portion 390 of the first bank array 310, the sub-array block SCB, two of the bit-line sense amplifier regions BLSAB, two of the sub word-line driver regions SWB and four of the conjunction regions CONJ are disposed.

The sub-array block SCB includes a plurality of word-lines WL1~WL4 extending in a row direction (the second direction D2) and a plurality of bit-line pairs BTL1/BTLB1 and BTL2/BTLB2 extending in a column direction (the first direction D1). The sub-array block SCB includes a plurality of memory cells MCs disposed at intersections of the word-lines WL1~WL4 and the bit-line pairs BTL1/BTLB1 and BTL2/BTLB2. In some example embodiments, the sub-array block SCB may include a plurality of word-lines WL1~WL4 extending in a row direction (the second direction D2) and a plurality of bit-line pairs BTL1~BTL4 extending in a column direction (the first direction DD. The sub-array block SCB may include a plurality of memory cells MCs disposed at intersections of the word-lines WL1~WL4 and the bit-line pairs BTL1~ BTL4. Each of the memory cells MCs includes an access (cell) transistor coupled to one of the word-lines WL1~WL4 and one of the bit-lines BTL1~BTL4 and a storage (cell) capacitor coupled to the cell transistor. The memory cells MCs may be connected to the word-lines WL1~WL4 and the bit-lines BTL1~BTL4 as shown in FIG. 6.

With reference to FIG. 8, the sub word-line driver regions SWB include a plurality of sub word-line drivers 551, 552, 553 and 554 that respectively drive the word-lines WL1~WL4. The sub word-line drivers 551 and 552 may be disposed in the sub word-line driver region SWB, which is leftward (in this example), with respect to the sub-array block SCB. In addition, the sub word-line drivers 553 and 554 may be disposed in the sub word-line driver region SWB, which is rightward (in this example), with respect to the sub-array block SCB.

The bit-line sense amplifier regions BLSAB include bit-line sense amplifiers 560 (BLSA) and 570 (BLSA) respectively coupled to the bit-line pairs BTL1 and BTLB1 and BTL2 and BTLB2, and local sense amplifier circuits 580 and 590. The bit-line sense amplifier 560 may sense and amplify a voltage difference between the bit-line pair BTL1 and BTLB1 to provide the amplified voltage difference to a local I/O line pair LIO1 and LIOB1.

The local sense amplifier circuit 580 controls electrical connection between the local I/O line pair LIO1 and LIOB1 and a global I/O line pair GIO1 and GIOB1. The local sense amplifier circuit 590 controls electrical connection between the local I/O line pair LIO2 and LIOB2 and a global I/O line pair GIO2 and GIOB2.

As illustrated in FIG. 8, the bit-line sense amplifier 560 and the bit-line sense amplifier 570 may be alternately disposed at an upper portion and a lower portion of the sub-array block SCB. The conjunction regions CONJ are disposed adjacent to the bit-line sense amplifier regions BLSAB and the sub word-line driver regions SWB. The conjunction regions CONJ are also disposed at each corner of the sub-array block SCB in FIG. 8. A plurality of voltage generators 510, 520, 530 and 540 may be disposed in the conjunction regions CONJ.

Figure 9:
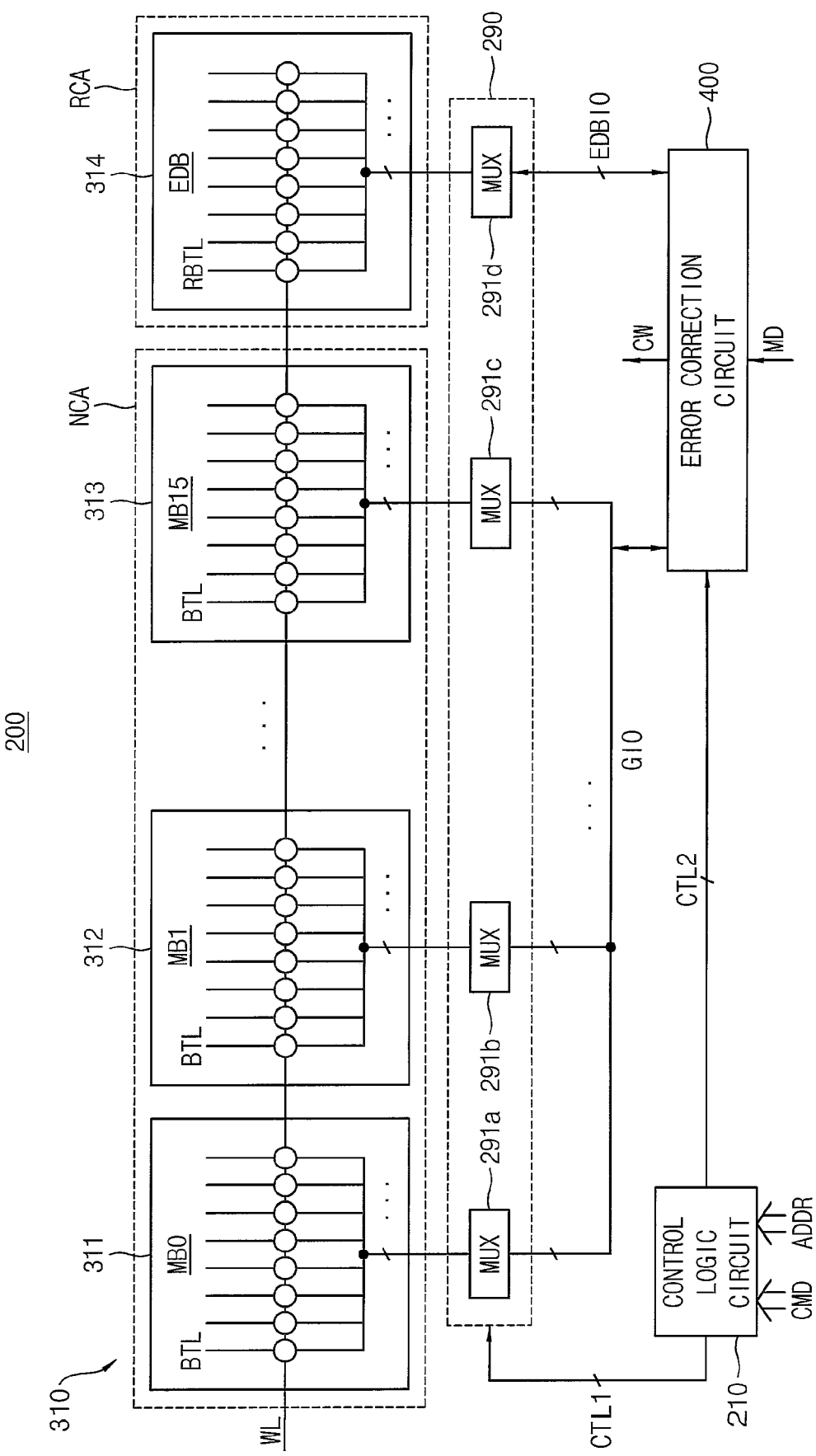
FIG. 9 illustrates a portion of the semiconductor memory device of FIG. 5 in a write operation according to some example embodiments.

FIG. 9 illustrates a portion of the semiconductor memory device of FIG. 5 in a write operation.

In FIG. 9, the control logic circuit 210, the first bank array 310, the I/O gating circuit 290, and the error correction circuit 400 are illustrated.

Referring to FIG. 9, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair or block repair to repair one or more failed cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells (e.g., DRAM cells) or resistive type memory cells. The second memory cells connected to inter-sections of the word-lines WL and bit-lines RBTL may be dynamic memory cells or resistive type memory cells. The first memory blocks 311~313 and the second memory block 314 may each be representative of a sub array block SCB in FIG. 7.

The I/O gating circuit 290 includes a plurality of switching circuits 291a~291d respectively connected to the first memory blocks 311~313 and the second memory block 314.

The error correction circuit 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the error correction circuit 400.

When the command CMD is a write command, the control logic circuit 210 provides the second control signal CTL2 to the error correction circuit 400. The error correction circuit 400 performs the ECC encoding on the main data MD to generate parity data associated with the main data MD and provides the I/O gating circuit 290 with the codeword CW including the main data MD and the parity data. The control logic circuit 210 provides the first control signal CTL1 to the I/O gating circuit 290 such that the codeword CW is to be stored in a sub-page of the target page in the first bank array 310.

Figure 10:
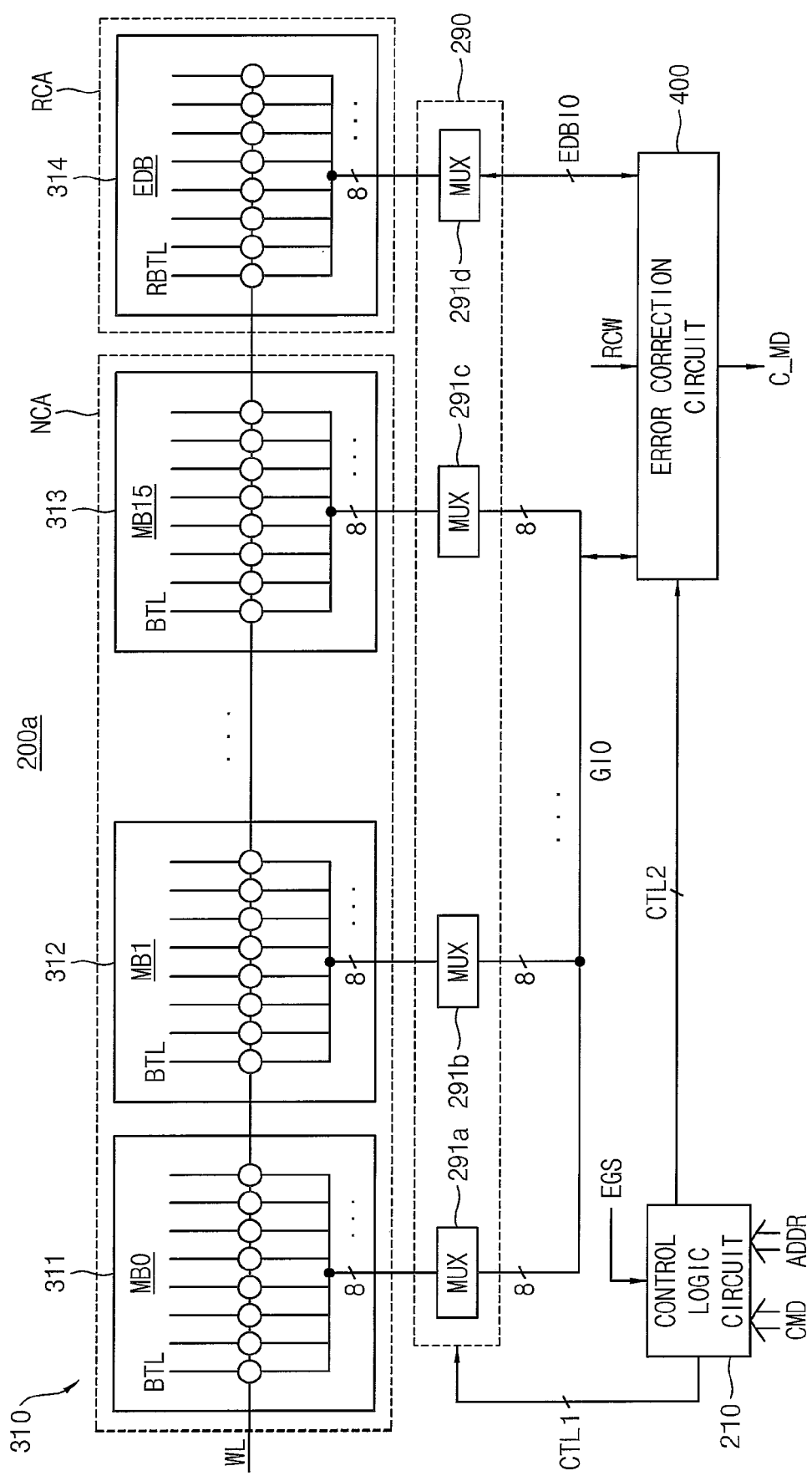
FIG. 10 illustrates a portion of the semiconductor memory device of FIG. 5 in a read operation according to some example embodiments.

FIG. 10 illustrates a portion of the semiconductor memory device of FIG. 5 in a read operation.

Referring to FIG. 10, when the command CMD is a read command (a second command) to designate a read operation, the control logic circuit 210 provides the first control signal CTL1 to the I/O gating circuit 290 such that a (read) codeword RCW stored in the sub-page of the target page in the first bank array 310 is provided to the error correction circuit 400.

The error correction circuit 400 performs ECC decoding on the read codeword RCW to correct the single bit error or two bit errors in the read codeword RCW based on the syndrome and the sub parity check matrix and outputs the corrected main data C_MD.

Figure 11:
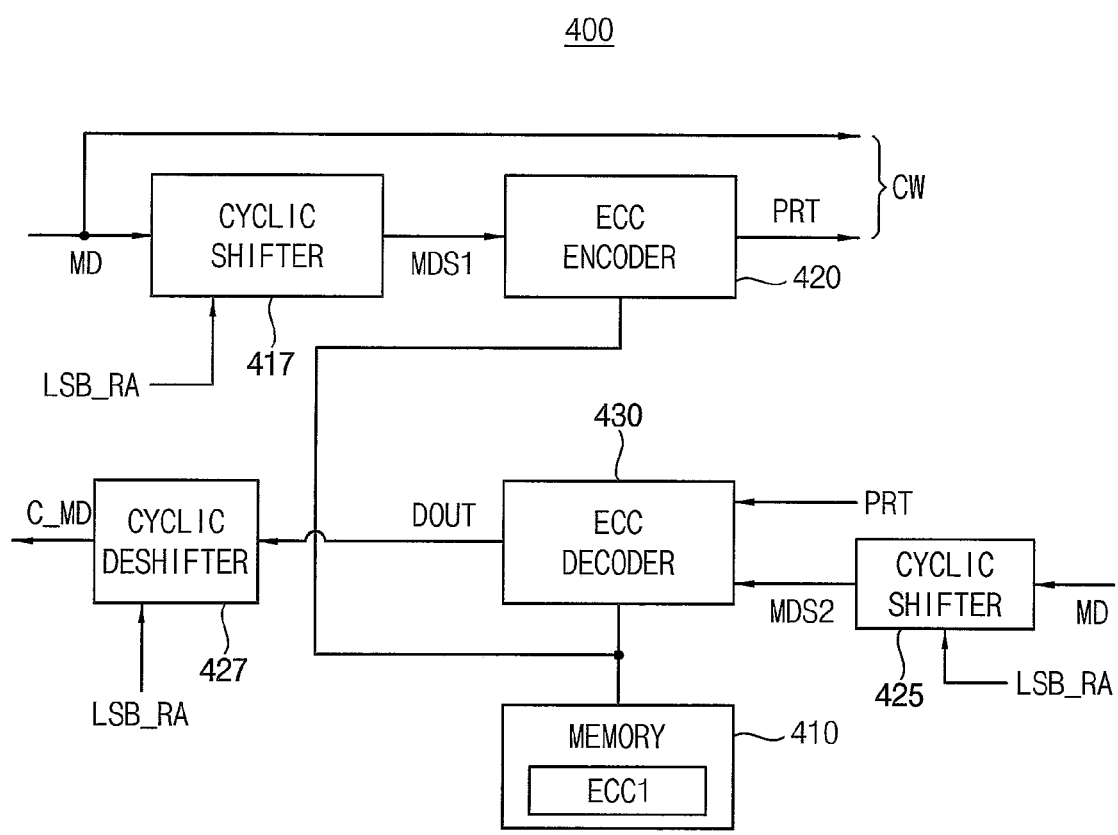
FIG. 11 is a block diagram illustrating an example of the error correction circuit in the semiconductor memory device of FIG. 5 according to some example embodiments.

FIG. 11 is a block diagram illustrating an example of the error correction circuit in the semiconductor memory device of FIG. 5 according to some example embodiments.

Referring to FIG. 11, the error correction circuit 400 may include an ECC memory 410, an ECC encoder 420, and an ECC decoder 430. The error correction circuit 400 may further include a first cyclic shifter 417, a second cyclic shifter 425 and a cyclic deshifter (de-shifter) 427.

The ECC memory 410 stores a first ECC ECC1. The first ECC ECC1 may be represented by a generation matrix. For example, a data format/structure of the first ECC ECC1 may be a generation matrix. The first ECC ECC1 may include a plurality of column vectors corresponding to data bits in the main data (e.g., MD) and the parity data.

The first cyclic shifter 417 may generate a first main data MDS1 by selectively cyclic-shifting the data bits of the main data MD in a first direction based on a least significant bit (LSB) of a row address LSB_RA and may provide the main data MDS1 to the ECC encoder 420.

For example, when the LSB of the row address LSB_RA is a low level (i.e., when the row address designates an even word-line), the first cyclic shifter 417 may output the first main data MDS1 by maintaining the data bits of the main data MD. For example, when the LSB of the row address LSB_RA is a high level (i.e., when the row address designates an odd word-line), the first cyclic shifter 417 may output the first main data MDS1 by cyclic-shifting the data bits of the main data MD in the first direction. In example embodiments, the first cyclic shifter 417 may output the first main data MDS1 by cyclic-shifting the data bits of the main data MD in the first direction by 8-bit basis.

The ECC encoder 420 is connected to the ECC memory 410, and may perform ECC encoding on the first main data MDS1 using the first ECC ECC1 stored in the ECC memory 410 to generate the parity data PRT in a write operation of the semiconductor memory device 200. The ECC encoder 420 may provide the I/O gating circuit 290 with the codeword CW including the main data MD and the parity data PRT.

The second cyclic shifter 425 may generate a second main data MDS2 by selectively cyclic-shifting the data bits of the main data MD read from the target page in the first direction based on the LSB of the row address LSB_RA and may provide the second main data MDS2 to the ECC decoder 430.

For example, when the LSB of the row address LSB_RA is a low level (i.e., when the row address designates an even word-line), the second cyclic shifter 425 may output the second main data MDS2 by maintaining the data bits of the main data MD. For example, when the LSB of the row address LSB_RA is a high level (i.e., when the row address designates an odd word-line), the second cyclic shifter 425 may output the second main data MDS2 by cyclic-shifting the data bits of the main data MD in the first direction. In example embodiment, the second cyclic shifter 425 may output the second main data MDS2 by cyclic-shifting the data bits of the main data MD in the first direction by 8-bit basis.

Therefore, when the LSB of the row address LSB_RA is a low level, each order of the data bits of the first main data MDS1 and the data bits of the second main data MDS2 may be the same as an order of the data bits of the main data MD.

Therefore, when the LSB of the row address LSB_RA is a high level, an order of the data bits of the first main data MDS1 may be the same as an order of the data bits of the second main data MDS2, and each order of the data bits of the first main data MDS1 and the data bits of the second main data MDS2 may be different from an order of the data bits of the main data MD.

The ECC decoder 430 is connected to the ECC memory 410, may receive the second main data MDS2 and the parity data PRT as the codeword CW, may perform ECC decoding on the second main data MDS2 based on the parity data PRT using the first ECC ECC1 to correct and/or detect an error bit in the main data MD, and may provide an output data DOUT.

The cyclic deshifter 427 may provide the corrected main data C_MD to the data I/O buffer 295 by selectively cyclic-shifting data bits of the output data DOUT in a second direction opposite to the first direction based on the LSB of the row address LSB_RA.

Therefore, when the LSB of the row address LSB_RA is a low level, the cyclic deshifter 427 may output the corrected main data C_MD by maintaining order of the data bits of the output data DOUT. When the LSB of the row address LSB_RA is a high level, the cyclic deshifter 427 may output the corrected main data C_MD by cyclic-shifting the data bits of the output data DOUT in the second direction. Therefore, an order of the data bits of the corrected main data C_MD may be the same as the order of the data bits of the main data MD.

Although it is described with reference to FIG. 11 that the ECC memory 410 is coupled to the ECC encoder 420 and the ECC decoder 430, in example embodiments, the ECC memory 410 may be implemented with exclusive OR gates within the ECC encoder 420 and the ECC decoder 430.

FIGS. 12A through 12D illustrate examples of error bit in data pattern stored in a sub array block according to a LSB of the row address, respectively.

Figure 12C:
Figure 12D:
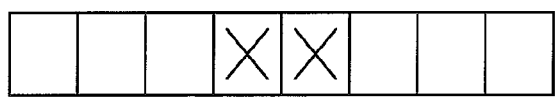

FIGS. 12A and 12C illustrate that a single bit error occurs in a data pattern, respectively. FIGS. 12B and 12D illustrate that two bit errors occur in adjacent two memory cells, respectively.

In FIGS. 12A through 12D, X denotes an error bit.

Referring to FIG. 12A, the LSB of the row address is a low level such that the row address designates a target page coupled to an even word-line, and a memory cell designated by a CINX 1 (cell index) includes a single bit error.

Referring to FIG. 12B, the LSB of the row address is a low level, and each of two memory cells designated by CINX 4 and CINX 5 includes an error bit. For example, two bit errors occur in the adjacent two memory cells designated by CINX 4 and CINX 5. In FIG. 12B, for example, two bit errors do not occur or only a low probability exists that two bit errors occur in the adjacent two memory cells designated by, for example, CINX 1 and CINX 2, CINX 3 and CINX 4, and CINX 5 and CINX 6.

Referring to FIG. 12C, the LSB of the row address is a high level such that the row address designates a target page coupled to an odd word-line, and a memory cell designated by CINX 3 includes a single bit error.

Referring to FIG. 12D, the LSB of the row address is a high level, and each of memory cells designated by CINX 3 and CINX 4 includes an error bit. For example, two bit errors occur in the adjacent two memory cells designated by CINX 3 and CINX 4. In FIG. 12D, for example, two bit errors do not occur or only a low probability exists that two bit errors occur in the adjacent two memory cells designated by, for example, CINX 0 and CINX 1, CINX 2 and CINX 3, CINX 4 and CINX 5, and CINX 6 and CINX 7.

Two bit errors do not occur or only a low probability exists that two bit errors occur in most pairs of adjacent two memory cells as illustrated in FIGS. 12B and 12D, because the memory cells of the target page have different structure depending on the LSB of the row address as described with reference to FIGS. 6 and 8.

Figure 13:
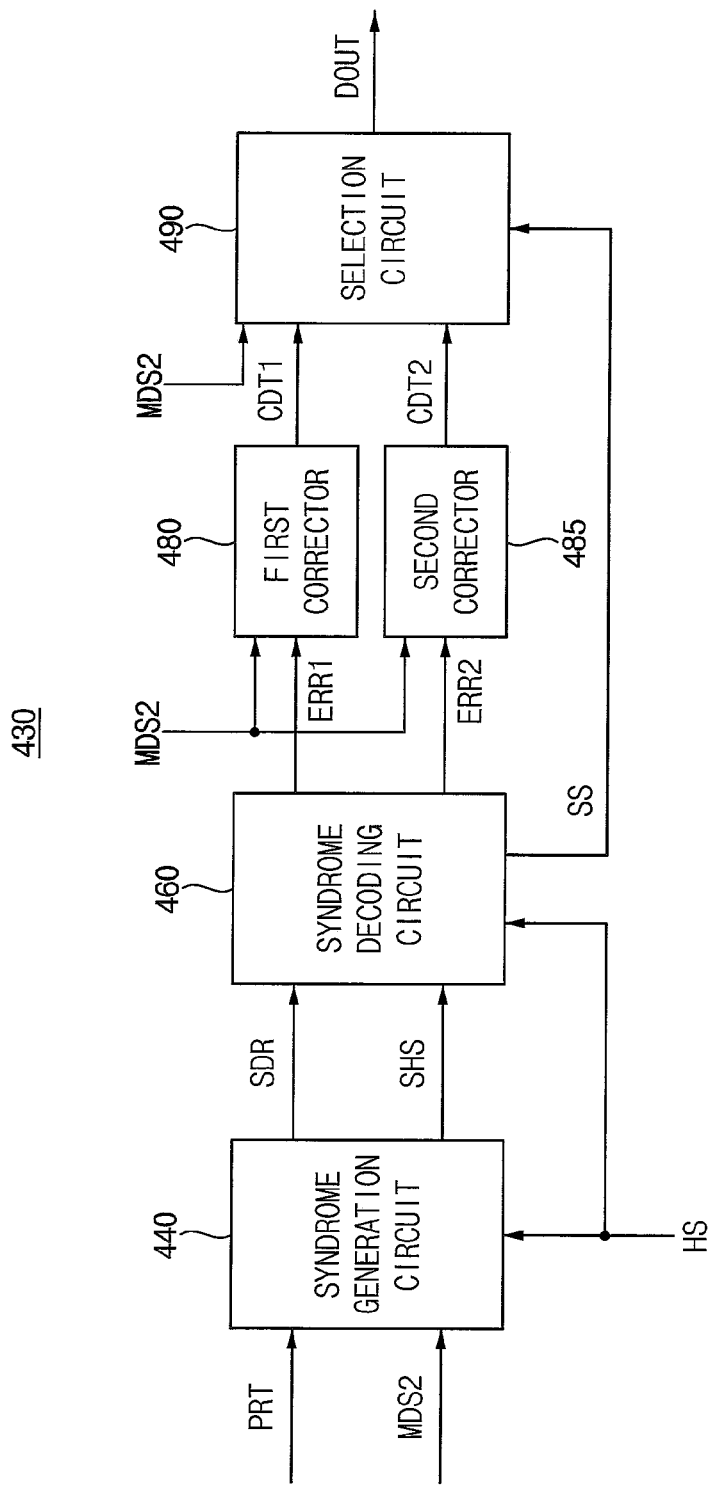
FIG. 13 is a block diagram illustrating the ECC decoder in the error correction circuit of FIG. 11 according to some example embodiments.

FIG. 13 is a block diagram illustrating the ECC decoder in the error correction circuit of FIG. 11 according to some example embodiments.

Referring to FIG. 13, the ECC decoder 430 may include a syndrome generation circuit 440, a syndrome decoding circuit 460, a first corrector 480, a second corrector 485 and a selection circuit 490.

The syndrome generation circuit 440 may generate a syndrome SDR and a sub parity check matrix SHS based on a parity check matrix HS, the second main data MDS2 and the parity data PRT. The syndrome generation circuit 440 may generate the syndrome SDR by applying the parity check matrix HS to the second main data MDS2 and the parity data PRT, and may generate the sub parity check matrix SHS by performing XOR operation on each adjacent two column vectors of the parity check matrix HS.

The syndrome decoding circuit 460 may generate a first error decoding signal ERR1 associated with the single bit error, a second error decoding signal ERR2 associated with the two bit errors and a selection signal SS by decoding the syndrome SDR based on the parity check matrix HS and the sub parity check matrix SHS.

The first corrector 480 may correct the single bit error in the second main data MDS2 based on the first error decoding signal ERR1 to provide a first corrected data CDT1. The second corrector 485 may correct adjacent two bit errors in the second main data MDS2 based on the second error decoding signal ERR2 to provide a second corrected data CDT2.

The selection circuit 490 may receive the second main data MDS2, the first corrected data CDT1 and the second corrected data CDT2, may select one of the second main data MDS2, the first corrected data CDT1 and the second corrected data CDT2 in response to the selection signal SS and may output the selected one as the output data DOUT.

When all bits of the syndrome SDR are 'zero' and the first error decoding signal ERR1 and the second error decoding signal ERR2 indicate that the second main data MDS2 includes no errors, the selection circuit 490 may provide the second main data MDS2 as the output data DOUT in response to the selection signal SS.

When the bits of the syndrome SDR are not all 'zero' and the first error decoding signal ERR1 indicates that the second main data MDS2 includes a single bit error, the selection circuit 490 may provide the first corrected data CDT1 as the output data DOUT in response to the selection signal SS. When the bits of the syndrome SDR are not all 'zero' and the second error decoding signal ERR2 indicates that the second main data MDS2 includes adjacent two bit errors, the selection circuit 490 may provide the second corrected data CDT2 as the output data DOUT in response to the selection signal SS.

Although not illustrated, in example embodiment, the syndrome decoding circuit 460 may perform an OR operation on the first error decoding signal ERR1 and the second error decoding signal ERR2 and may provide a result of the OR operation to one corrector. The one corrector may provide output data DOUT by maintaining the second main data MDS2, correcting a single bit error in the second main data MDS2 or correcting adjacent two bit errors in the second main data MDS2. In this case, the selection circuit 490 may not be included in the ECC decoder 430.

Figure 14:
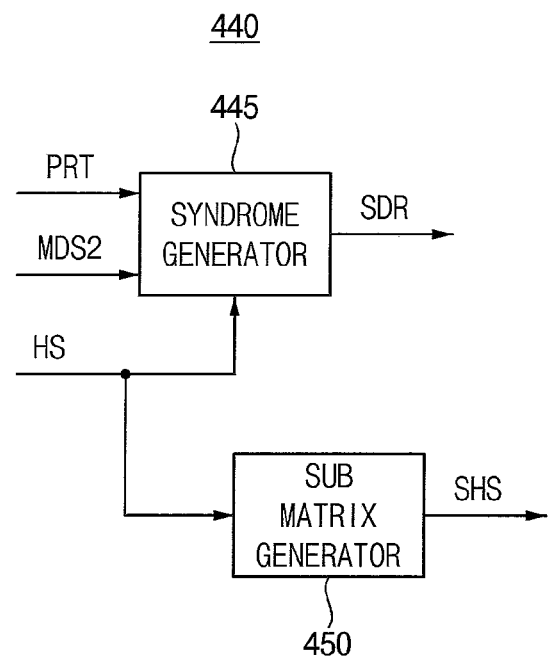
FIG. 14 is a block diagram illustrating an example of the syndrome generation circuit in the ECC decoder of FIG. 13 according to some example embodiments.

FIG. 14 is a block diagram illustrating an example of the syndrome generation circuit in the ECC decoder of FIG. 13 according to some example embodiments.

Referring to FIG. 14, the syndrome generation circuit 440 may include a syndrome generator 445 and a sub check matrix generator 450.

The syndrome generator 445 may generate the syndrome SDR based on the parity check matrix HS, the second main data MDS2 and the parity data PRT. The syndrome generator 445 may generate the syndrome SDR by applying the parity check matrix HS to the second main data MDS2 and the parity data PRT.

The sub check matrix generator 450 may generate the sub parity check matrix SHS based on the parity check matrix HS. The sub check matrix generator 450 may generate the sub parity check matrix SHS by performing an XOR operation on a (2i−1)-th column vector adjacent to a (2i)-th column vector and the (2i)-th column vector of column vectors in each of a plurality of code groups in the parity check matrix HS. Here, i is one of 1 to k, and k is a number of data bits in each of the sub data units.

Figure 15:
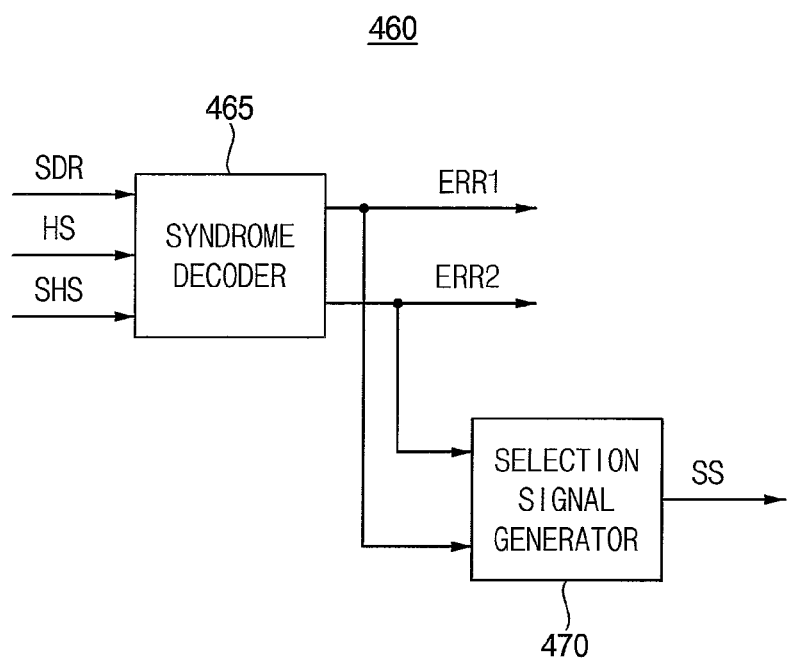
FIG. 15 is a block diagram illustrating an example of the syndrome decoding circuit in the ECC decoder of FIG. 13 according to some example embodiments.

FIG. 15 is a block diagram illustrating an example of the syndrome decoding circuit in the ECC decoder of FIG. 13 according to some example embodiments.

Referring to FIG. 15, the syndrome decoding circuit 460 may include a syndrome decoder 465 and a selection signal generator 470.

The syndrome decoder 465 may compare the syndrome SDR to the parity check matrix HS and the sub parity check matrix SHS to generate the first error decoding signal ERR1 and the second error decoding signal ERR2 based on a result of the comparison.

When all bits of the syndrome SDR are 'zero', the first error decoding signal ERR1 and the second error decoding signal ERR2 indicate that the second main data MDS2 includes no errors.

When the bits of the syndrome SDR match one of a plurality of column vectors of the parity check matrix HS, the syndrome decoder 465 may indicate a position of the single bit error with the first error decoding signal ERR1. When the bits of the syndrome SDR match one of a plurality of column vectors of the sub parity check matrix SHS, the syndrome decoder 465 may indicate positions of the adjacent two bit errors with the second error decoding signal ERR2.

The selection signal generator 470 may generate the selection signal SS indicating a type of error based on the first error decoding signal ERR1 and the second error decoding signal ERR2. The selection signal generator 470 may generate the selection signal SS further based on the syndrome SDR.

Figure 16:
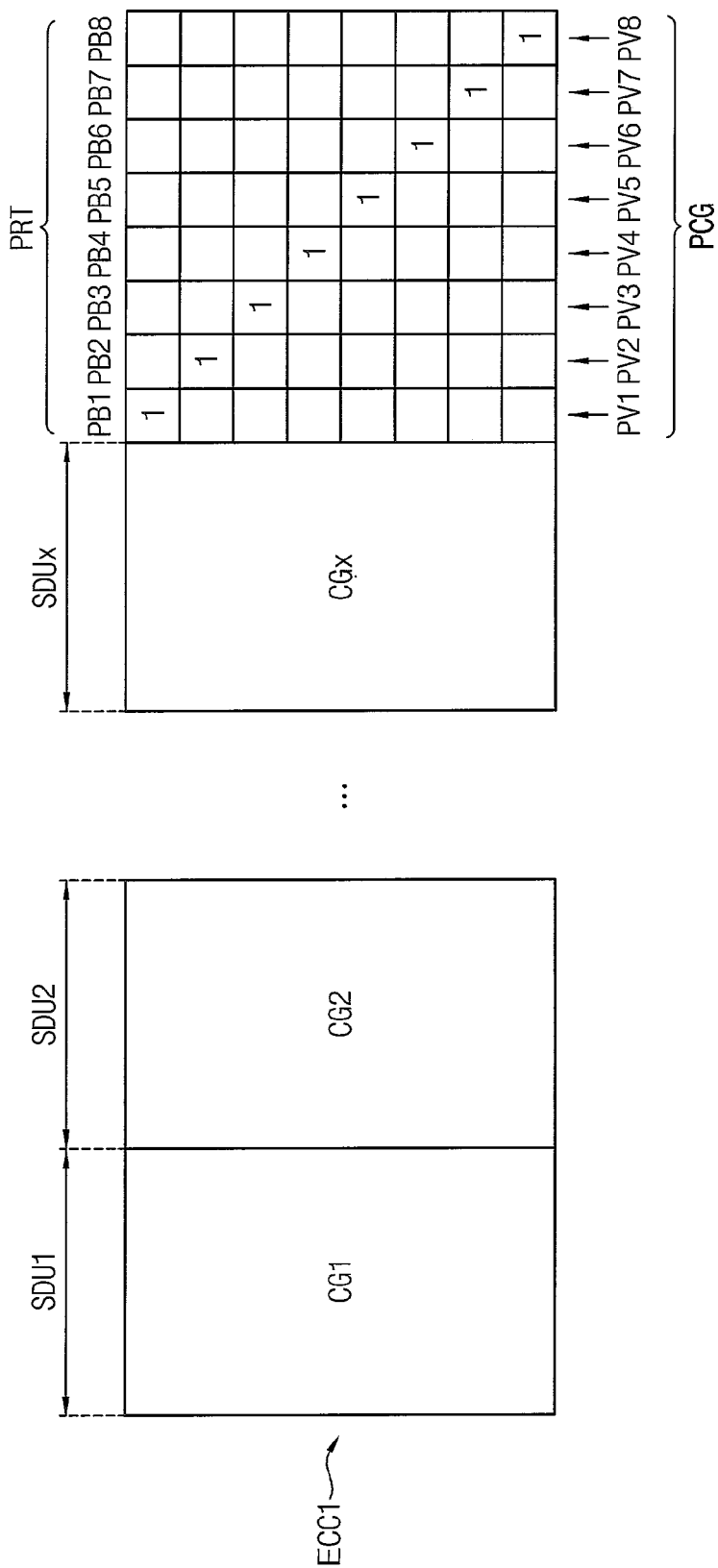
FIG. 16 illustrates relationships of the first ECC and the parity bits used in the error correction circuit of FIG. 11 according to some example embodiments.

FIG. 16 illustrates relationships of the first ECC ECC1 and the parity bits used in the error correction circuit of FIG. 11 according to some example embodiments.

In FIG. 16, it is assumed that the main data MD includes a plurality of sub data units SDU1~SDUx, and the parity data PRT includes 8-bit parity bits PB1~PB8. In FIG. 16, it is assumed that x is a natural number equal to or greater than eight.

Referring to FIG. 16, the first ECC ECC1 may be divided into a plurality of code groups CG1~CGx and PCG corresponding to the plurality of sub data units SDU1~SDUx and the parity data PRT. The code group PCG may include a plurality of column vectors PV1~PV8 corresponding to parity bits PB1~PB8 of the parity data PRT.

Figure 17:
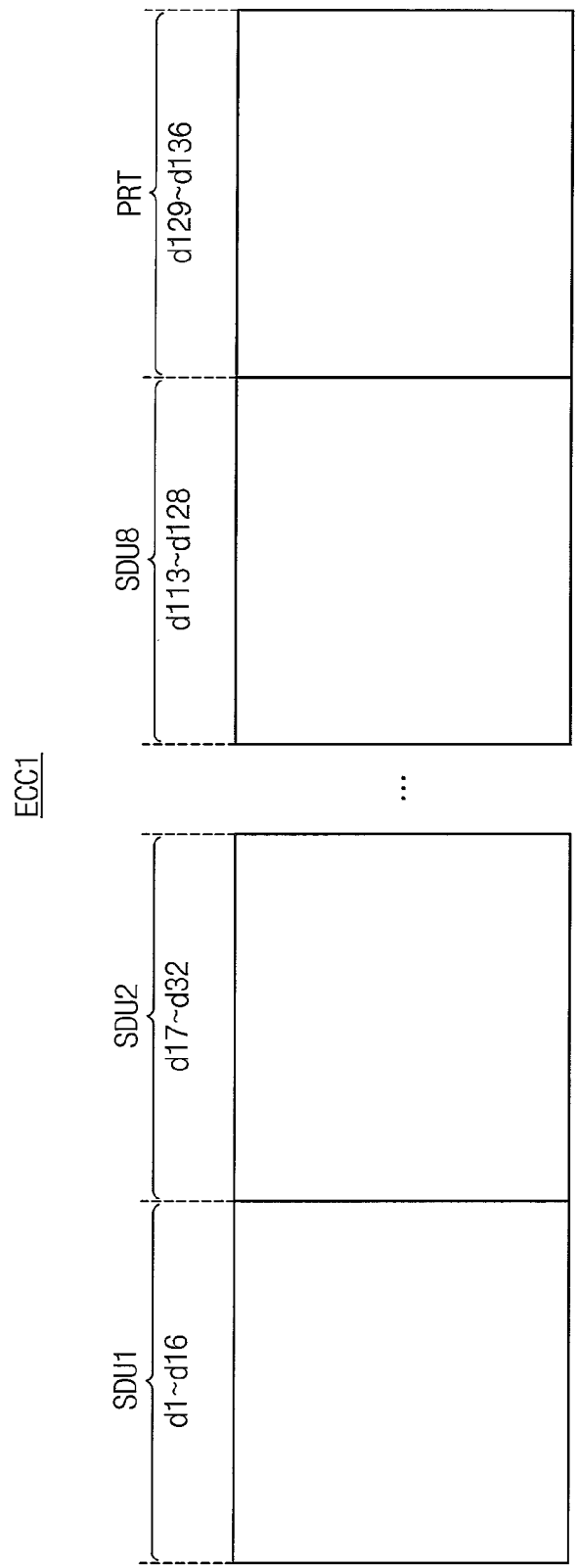
FIG. 17 illustrates an example of the first ECC in FIG. 16 according to some example embodiments.

FIG. 17 illustrates an example of the first ECC ECC1 in FIG. 16 according to some example embodiments.

In FIG. 17, it is assumed that the main data MD includes 128-bit data bits d1~d128 and the parity bits PB1~PB8 corresponds to data bits d129~d136. That is, it is assumed that x is eight in FIG. 17.

Referring to FIG. 17, the data bits d1~d128 of the main data MD may be divided into first through eighth sub data units SDU1~SDU8. Each of the first through eighth sub data units SDU1~SDU8 includes 16-bit data bits.

Each of the first through eighth sub data units SDU1~SDU8 may correspond to respective one of the sub array blocks SCB in the second direction D2 in FIG. 7. In addition, one symbol may include adjacent two sub data units corresponding to two sub array blocks SCB adjacent to the sub word-line driver region in FIG. 7.

The first ECC ECC1, i.e., the parity check matrix HS mentioned above with respect to FIG. 13, includes first through eighth code groups CG1~CG8 corresponding to the first through eighth sub data units SDU1~SDU8 and the code group PCG corresponding to the parity bits PB1~PB8.

FIGS. 18A through 18E illustrate examples of the parity check matrix of FIG. 17.

Referring to 18A through 18E, the parity check matrix HS includes first through eighth code groups CG1~CG8 corresponding to the first through eighth sub data units SDU1~SDU8 and a code group PCG corresponding to the parity data PRT.

The first through eighth code groups CG1~CG8 include column vectors CV11~CV116, CV21~CV216, CV31~CV316, CV41~CV416, CV51~CV516, CV61~CV616, CV71~CV716, and CV81~CV816, and the code group PCG includes column vectors PV1~PV8.

The column vectors CV11~CV116 correspond to the data bits d1~d16. The column vectors CV21~CV216 correspond to the data bits d17~d32. The column vectors CV31~CV316 correspond to the data bits d33~d48. The column vectors CV41~CV416 correspond to the data bits d49~d64. The column vectors CV51~CV516 correspond to the data bits d65~d80. The column vectors CV61~CV616 correspond to the data bits d81~d96. The column vectors CV71~CV716 correspond to the data bits d97~d112. The column vectors CV81~CV816 correspond to the data bits d113~d128. The column vectors PV1~PV8 correspond to the data bits d129~d136. Each of the column vectors CV11~CV116, CV21~CV216, CV31~CV316, CV41~CV416, CV51~CV516, CV61~CV616, CV71~CV716, and CV81~CV816 does not match respective one of other column vectors.

The column vectors CV11~CV116, CV21~CV216, CV31~CV316, CV41~CV416, CV51~CV516, CV61~CV616, CV71~CV716, and CV81~CV816 in the first through eighth code groups CG1~CG8 may correct a single bit error in the main data MD and have elements to gather multiple error bits and a mis-corrected bit generated due to the multiple error bits in one symbol or have elements to such that a column vector corresponding to the mis-corrected bit is not the same as each of the column vectors.

A result of XOR operation on two column vectors which are not adjacent to each other from among the column vectors CV11~CV116 and CV21~CV216 in the first code group CG1 and the second code group CG2 corresponding to the one symbol and a result of XOR operation on three or more column vectors from among the column vectors CV11~CV116 and CV21~CV216 in the first code group CG1 and the second code group CG2 corresponding to the one symbol may be the same as one of the column vectors CV11~CV116 and CV21~CV216 or may be not the same as respective one of the CV31~CV316, CV41~CV416, CV51~CV516, CV61~CV616, CV71~CV716, and CV81~CV816.

The syndrome generation circuit 440 in FIG. 14 may generate the sub parity check matrix SHS based on the column vectors CV11~CV116, CV21~CV216, CV31~CV316, CV41~CV416, CV51~CV516, CV61~CV616, CV71~CV716 and CV81~CV816.

FIGS. 19A through 19D illustrate examples of the sub parity check matrix which is generated by using the parity check matrix.

The sub check matrix generator 450 in the ECC decoder 430 may generate the sub parity check matrix SHS by using the column vectors CV11~CV116, CV21~CV216, CV31~CV316, CV41~CV416, CV51~CV516, CV61~CV616, CV71~CV716 and CV81~CV816 of the parity check matrix HS.

Referring to FIGS. 18A through 18D and 19A through 19D, the sub check matrix generator 450 may generate the sub parity check matrix SHS by performing an XOR operation on a (2i−1)-th column vector and a (2i)-th column vector which are adjacent to each other in each of the code groups from among the plurality of column vectors CV11~CV116, CV21~CV216, CV31~CV316, CV41~CV416, CV51~CV516, CV61~CV616, CV71~CV716 and CV81~CV816 of the code groups CG1~CG8. Here, i is one of 1 to k, k is a number of data bits in each of the sub data units and k corresponds to 8. The sub parity check matrix SHS may include even column vectors ecv1~ecv64.

The even column vector ecv1 may be generated by performing an XOR operation on the column vectors CV11 and CV12 and the even column vector ecv2 may be generated by performing an XOR operation on the column vectors CV13 and CV14.

Figure 18A:
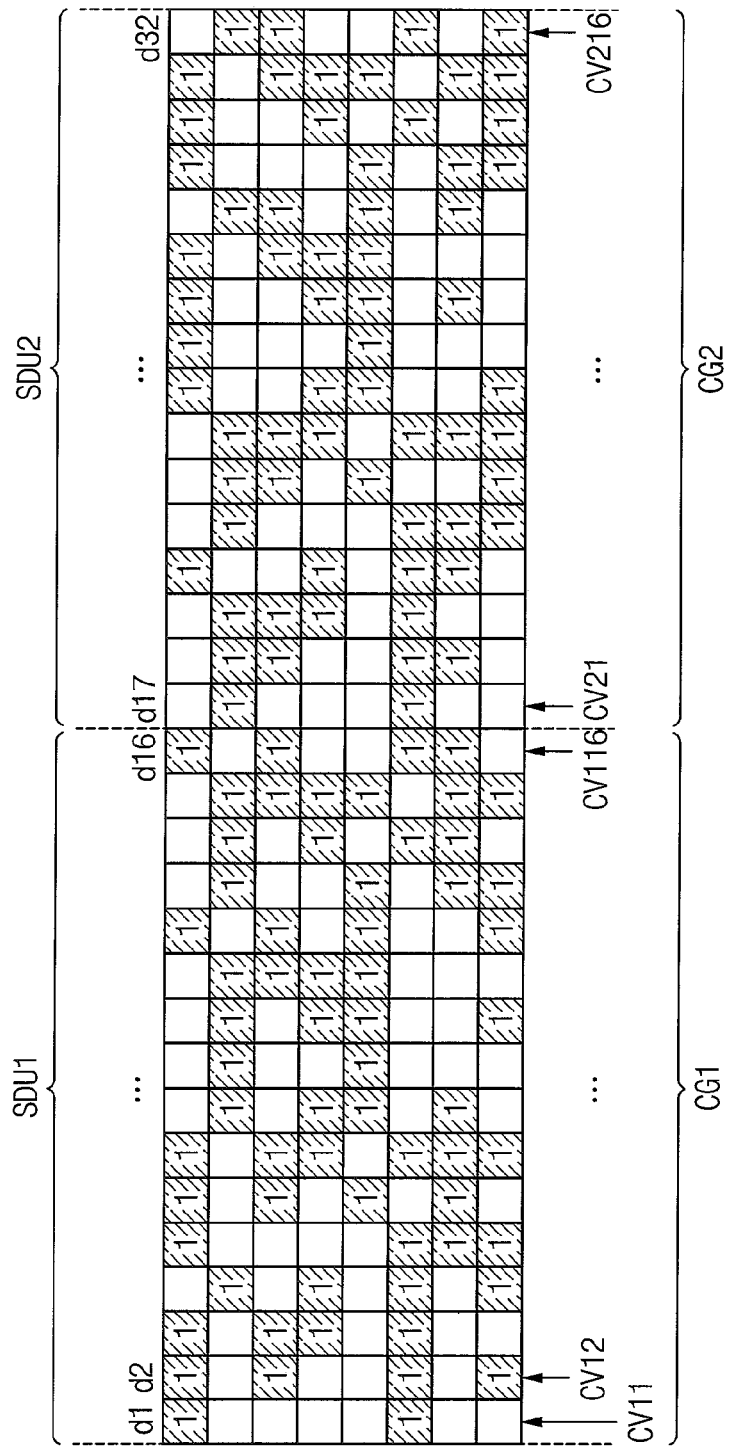
Figure 19A:
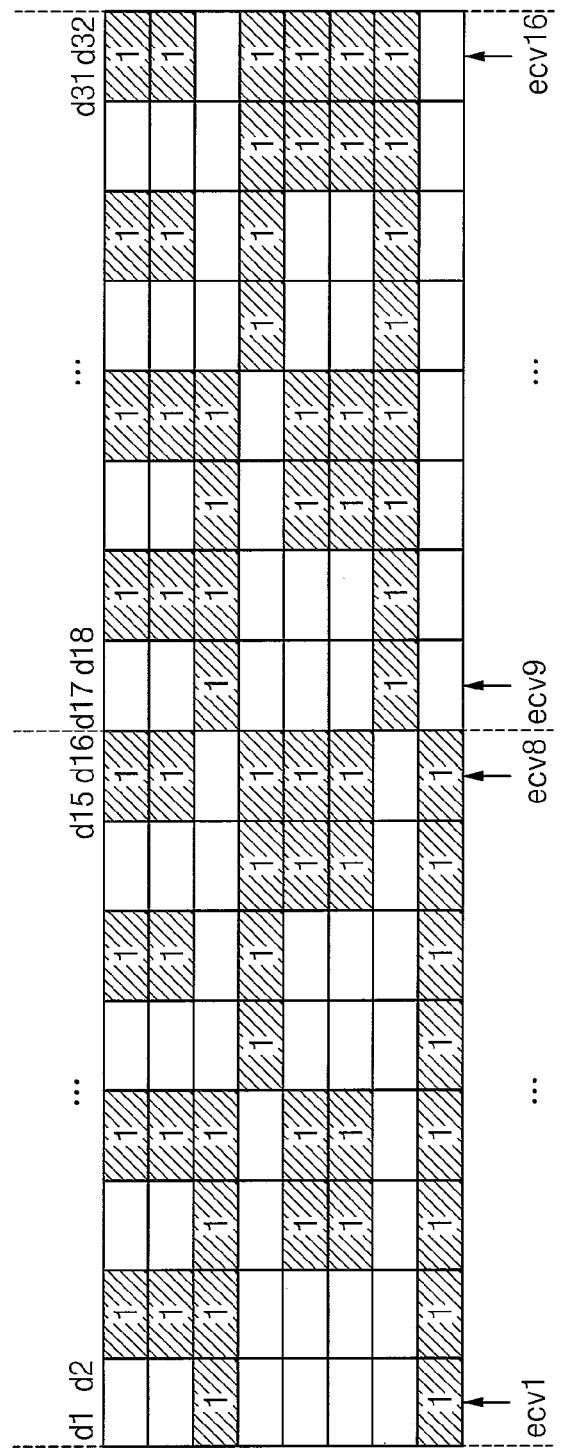
FIGS. 19A through 19D illustrate examples of the sub parity check matrix which is generated by using the parity check matrix.

The sub check matrix generator 450 may generate the even column vectors ecv1~ecv8 of FIG. 19A by sequentially performing an XOR operation on adjacent odd column vector and even column vector of the column vectors CV11~CV116 of the first code group CG1 of FIG. 18A. The sub check matrix generator 450 may generate the even column vectors ecv9~ecv16 of FIG. 19A by sequentially performing an XOR operation on adjacent odd column vector and even column vector of the column vectors CV21~CV216 of the second code group CG2 of FIG. 18A.

Figure 18B:
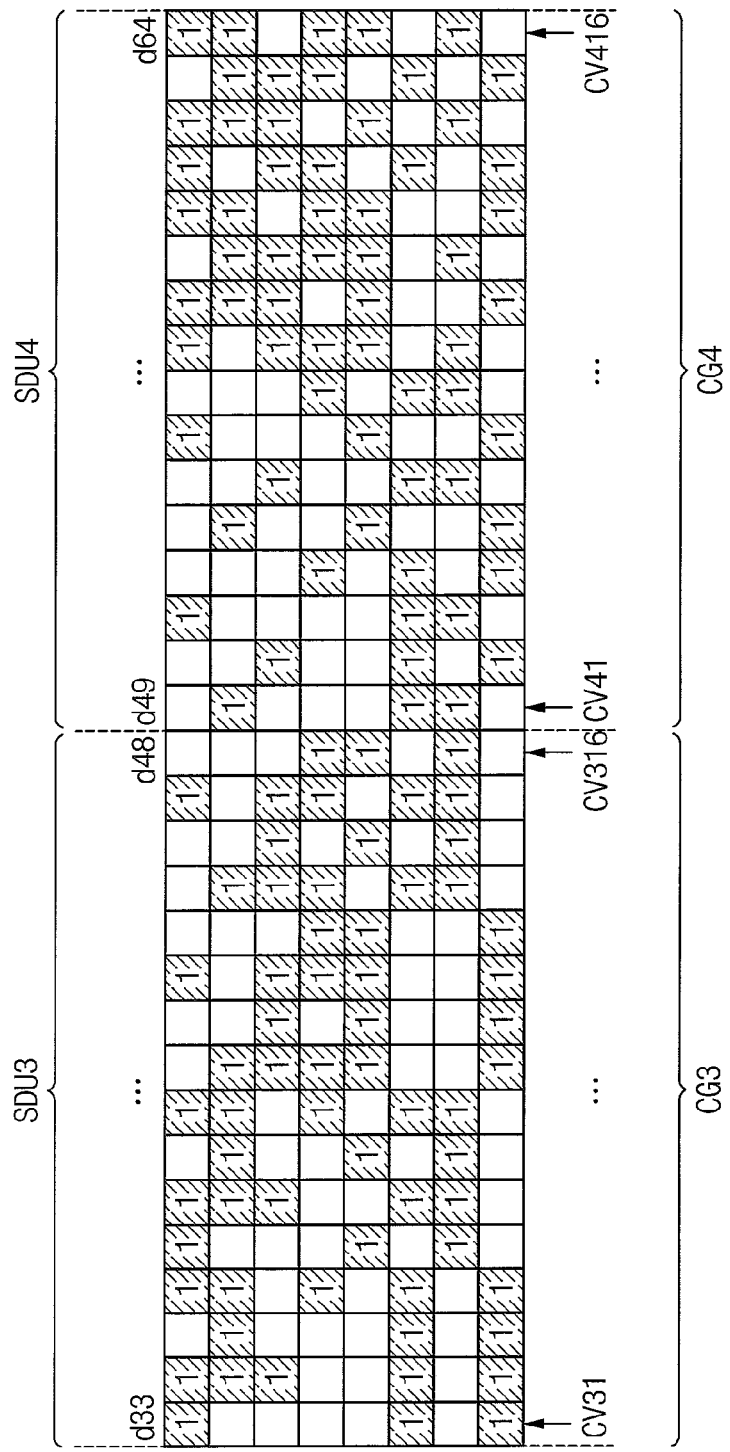
Figure 19B:
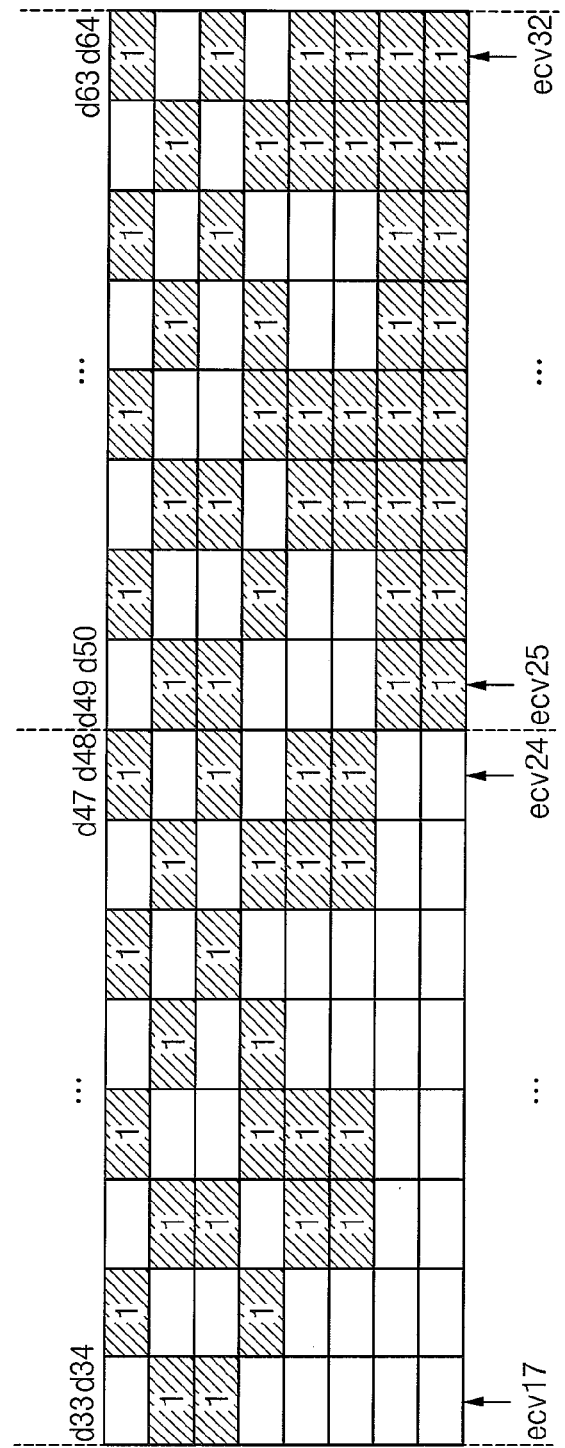

The sub check matrix generator 450 may generate the even column vectors ecv17~ecv24 of FIG. 19B by sequentially performing an XOR operation on adjacent odd column vector and even column vector of the column vectors CV31~CV316 of the third code group CG3 of FIG. 18B. The sub check matrix generator 450 may generate the even column vectors ecv25~ecv32 of FIG. 19B by sequentially performing an XOR operation on adjacent odd column vector and even column vector of the column vectors CV41~CV416 of the fourth code group CG4 of FIG. 18B.

Figure 18C:
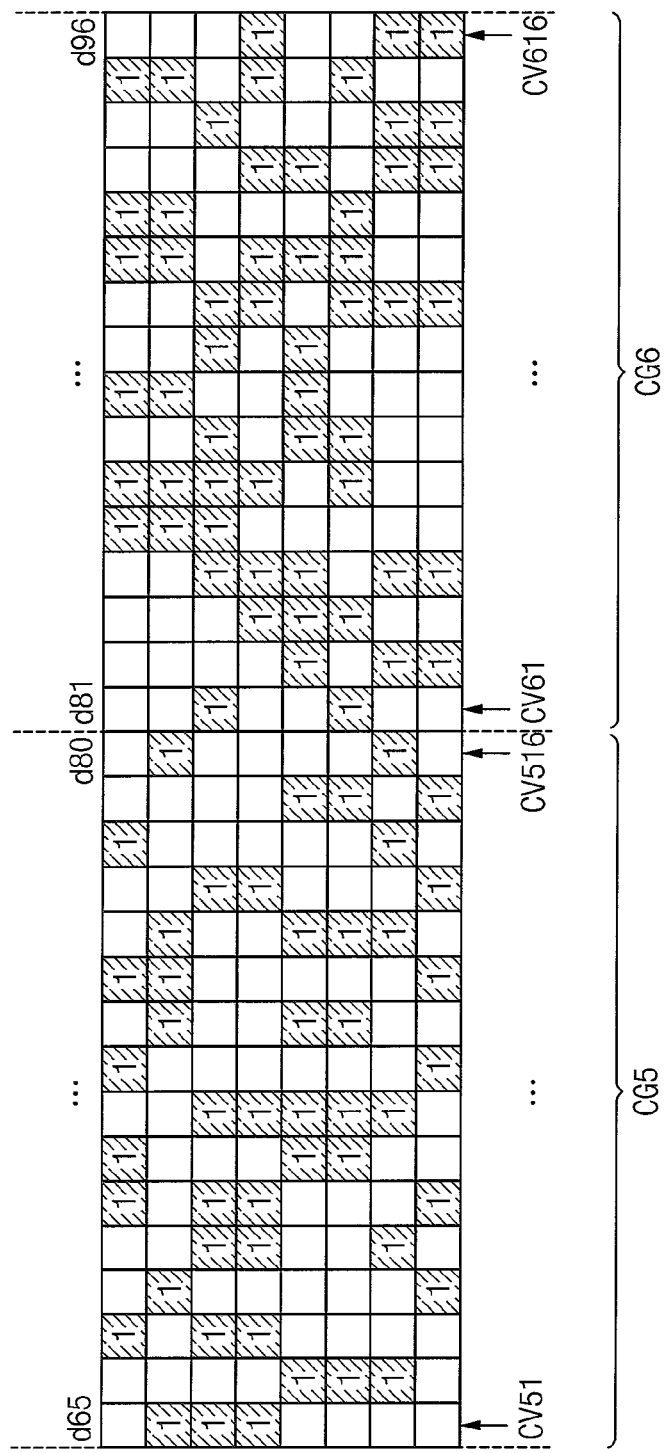
Figure 19C:
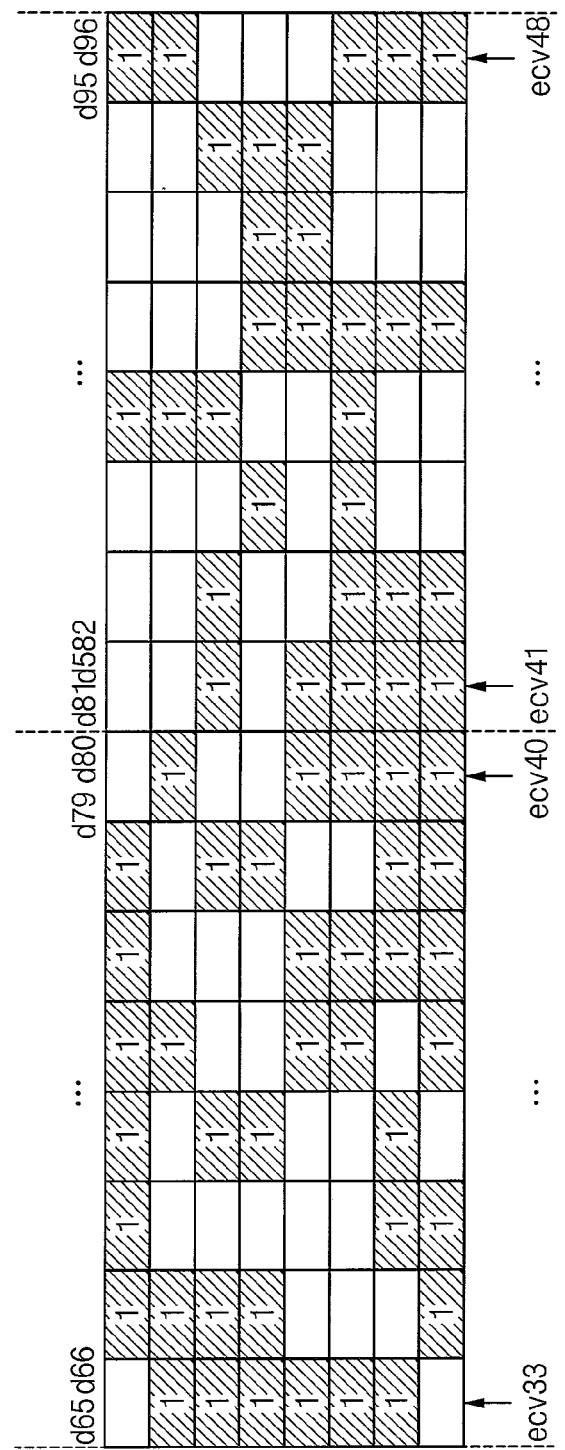

The sub check matrix generator 450 may generate the even column vectors ecv33~ecv40 of FIG. 19C by sequentially performing an XOR operation on adjacent odd column vector and even column vector of the column vectors CV51~CV516 of the fifth code group CG5 of FIG. 18C. The sub check matrix generator 450 may generate the even column vectors ecv41~ecv48 of FIG. 19C by sequentially performing an XOR operation on adjacent odd column vector and even column vector of the column vectors CV61~CV616 of the sixth code group CG6 of FIG. 18C.

Figure 18D:
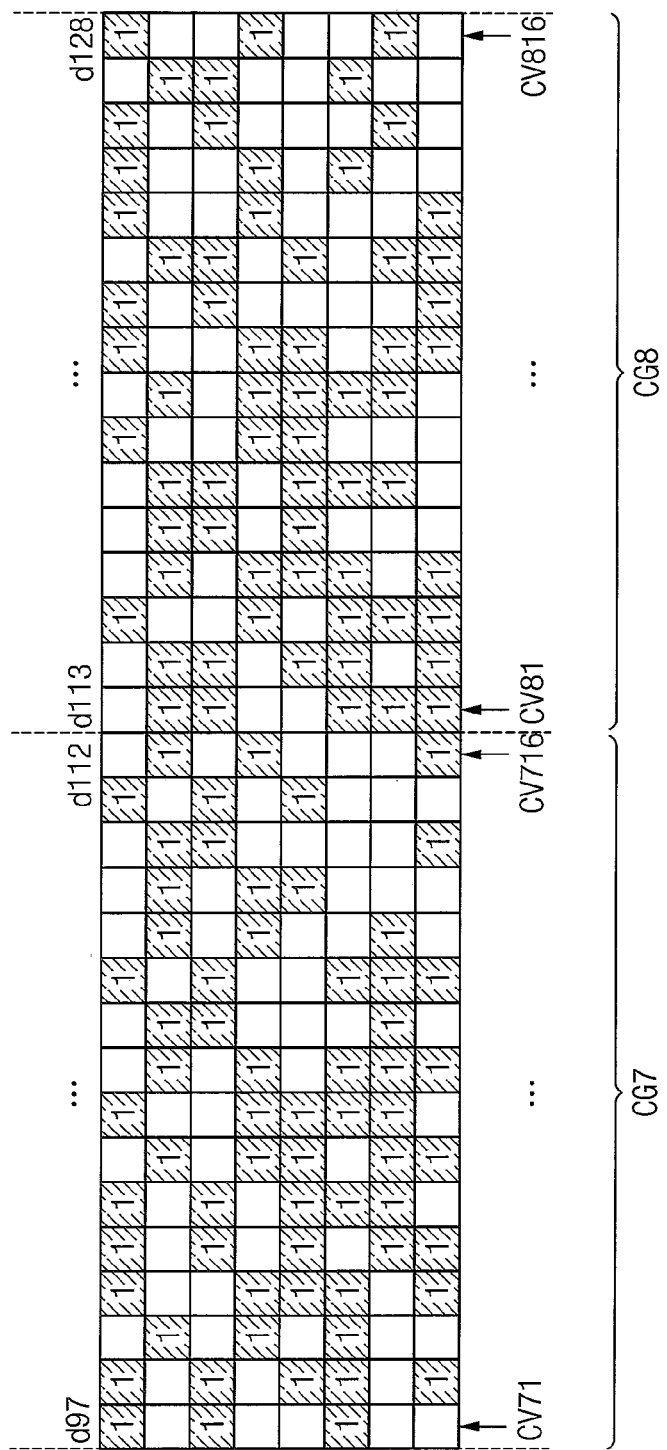
Figure 19D:
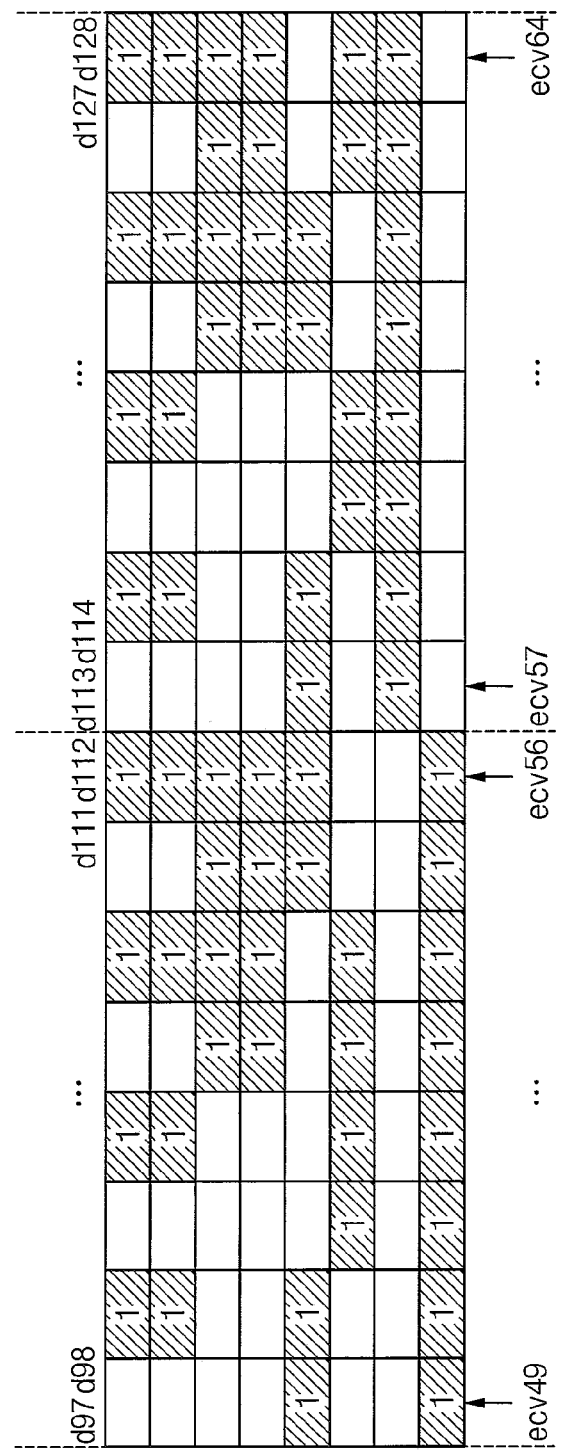

The sub check matrix generator 450 may generate the even column vectors ecv49~ecv56 of FIG. 19D by sequentially performing an XOR operation on adjacent odd column vector and even column vector of the column vectors CV71~CV716 of the seventh code group CG7 of FIG. 18D. The sub check matrix generator 450 may generate the even column vectors ecv57~ecv64 of FIG. 19D by sequentially performing an XOR operation on adjacent odd column vector and even column vector of the column vectors CV81~CV816 of the eighth code group CG8 of FIG. 18D.

The even column vectors ecv1~ecv64 may be applied to the main data in which the data bits are maintained when the LSB of the row address LSB_RA is a low level and may be applied to a main data in which the data bits are cyclic-shifted when the LSB of the row address LSB_RA is a high level.

Figure 20:
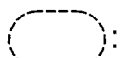
FIG. 20 illustrates an example of adjacent error bits when a memory cell array has a configuration in FIG. 6 according to some example embodiments.

FIG. 20 illustrates an example of adjacent error bits when a memory cell array has a configuration in FIG. 6 according to some example embodiments.

Referring to FIGS. 6 and 20, it is noted that bit-lines BTL coupled to a first memory cell and a second memory cell which are adjacent to each other and in which adjacent error bits cell-to-cell (C2C) ERROR occur in the first bank array 310 may be different depending on whether a word-line designated by a row address ROW_ADDR of the access address ADDR is an even word-line WLe or an odd word-line WLo. In addition, when an error occurs in a first memory cell, a probability that an error occurs in a second memory cell adjacent to the first memory cell may increase due to cell arrangement.

Figure 21B:
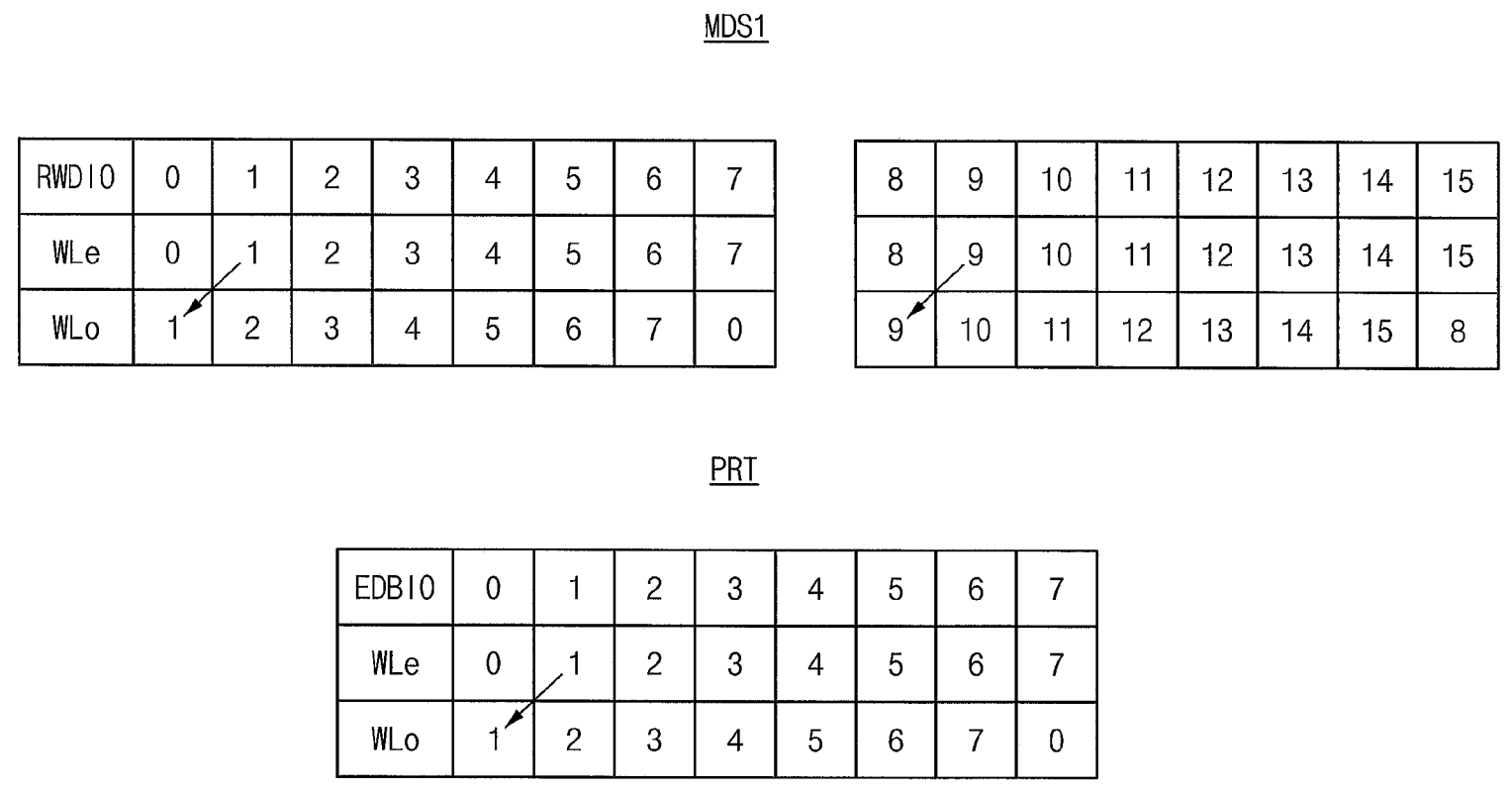

FIGS. 21A through 21C illustrate examples in which the main data and the parity data are selectively shifted in the error correction circuit of FIG. 11 based on whether a word-line designated by a row address is an even word-line or an odd word-line.

FIG. 21A illustrates a portion of the main data MD to be stored in the sub array block SCB in FIG. 7 through data I/O lines RWDIO (e.g., the first data lines GIO in FIG. 9).

FIG. 21A illustrates 16-bit data bits to be stored in the sub array block SCB in FIG. 7 from among the main data MD provided to the first cyclic shifter 417 in FIG. 11.

Referring to FIG. 21A, the data bits of the main data MD provided to the first cyclic shifter 417 in FIG. 11 are maintained without regard to whether a word-line designated by the row address ROW_ADDR of the access address ADDR is an even word-line WLe or an odd word-line WLo.

FIG. 21B illustrates 16-bit data bits to be stored in the sub array block SCB in FIG. 7 from among the first main data MDS1 output from the first cyclic shifter 417 in FIG. 11 and parity bits of the parity data PRT output from the ECC encoder 420 through the second data lines EDBIO.

Referring to FIG. 21B, when a word-line designated by the row address ROW_ADDR of the access address ADDR is an even word-line WLe, the first cyclic shifter 417 outputs the first main data MDS1 by maintaining the data bits of the main data MD and the ECC encoder 420 generates the parity data PRT based on the first main data MDS1. Therefore, the parity bits of the parity data PRT are not shifted.

In addition, when a word-line designated by the row address ROW_ADDR of the access address ADDR is an odd word-line WLo, the first cyclic shifter 417 outputs the first main data MDS1 by shifting the data bits of the main data MD in a first direction (a direction designated by an arrow) and the ECC encoder 420 generates the parity data PRT based on the first main data MDS1. Therefore, the parity bits of the parity data PRT are shifted in the first direction.

In addition, the 16-bit data bits and the parity bits of the parity data PRT of FIG. 21B may correspond to the main data and the parity data read from a target page.

FIG. 21C illustrates an example in which the ECC decoder 430 in FIG. 11 inverts an error bit in the second main data MDS2 based on an error decoding signal ERR.

Referring to FIG. 21C, when a word-line designated by the row address ROW_ADDR of the access address ADDR is an even word-line WLe, the ECC decoder 430 inverts a data bit designated by the error decoding signal ERR. When a word-line designated by the row address ROW_ADDR of the access address ADDR is an odd word-line WLo, the ECC decoder 430 inverts a data bit in a position shifted in a second direction (direction designated by an arrow) from a bit position designated by the error decoding signal ERR.

Figure 22:
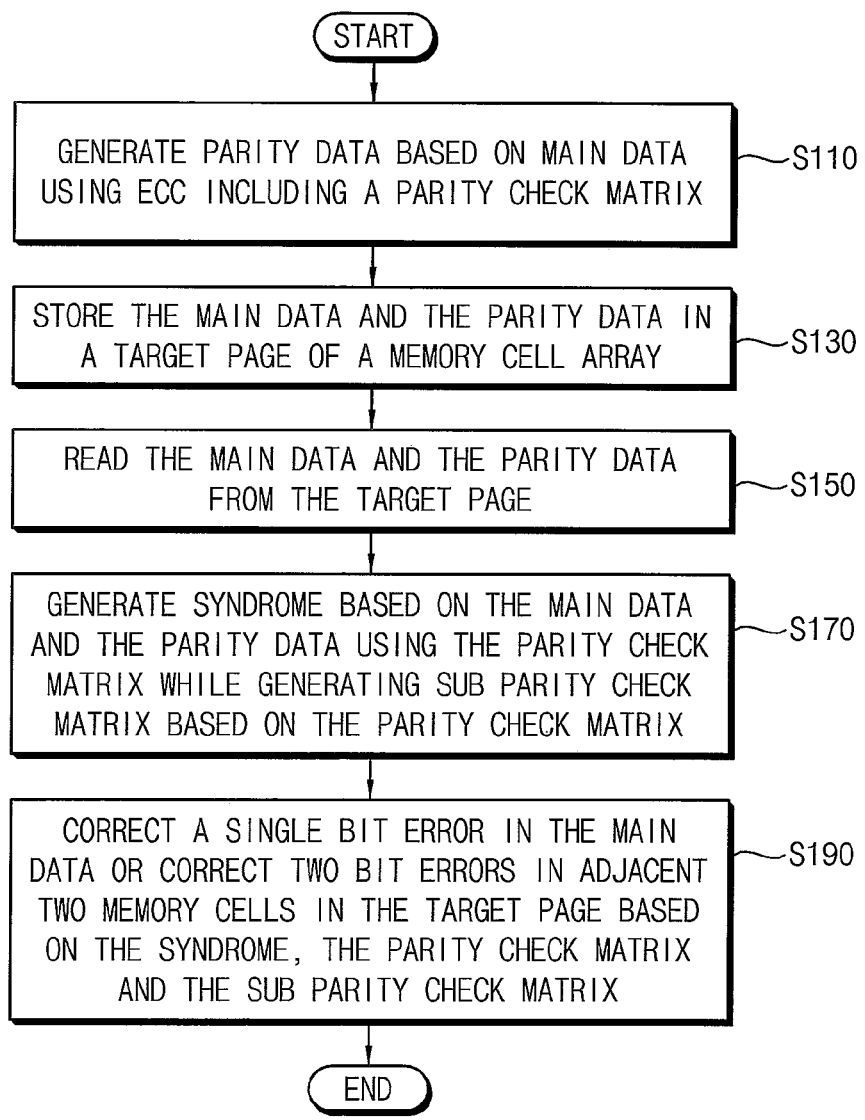
FIG. 22 is a flow chart illustrating a method of operating a semiconductor memory device according to some example embodiments.

FIG. 22 is a flow chart illustrating a method of operating a semiconductor memory device according to some example embodiments.

Referring to FIGS. 5 through 11, 12A through 12D, 13 through 17, 18A through 18E, 19A through 19D, 20, 21A through 21C, and 22, in a method of operating a semiconductor memory device 200 including a memory cell array 300, an error correction circuit 400 generates a parity data PRT based on the main data MD, by using a first ECC ECC1 (S110).

The first ECC ECC1 may be represented by a generation matrix, may include a plurality of column vectors, and the column vectors may be divided into a plurality of code groups corresponding to sub data units of the main data MD and the parity data PRT. The column vectors may have elements to gather a mis-corrected bit and multiple error bits in one symbol and the mis-corrected bit may be generated when the multiple error bits are present in the main data. The one symbol may include two adjacent sub data units of the sub data units. The column vectors may have elements to place the mis-corrected bit in sub data units corresponding to the one symbol or have elements such that a column vector corresponding to the mis-corrected bit is not the same as each of the column vectors.

The error correction circuit 400 stores the main data MD and the parity data PRT in a target page of the memory cell array 300 via an I/O gating circuit 290 (S130).

The error correction circuit 400 reads the main data MD and the parity data PRT from the target page of the memory cell array 300 via the I/O gating circuit 290 (S150).

The error correction circuit 400 generates a syndrome SDR based on the main data MD and the parity data by using a parity check matrix HS and generates a sub parity check matrix SHS based on the parity check matrix HS (S170).

The error correction circuit 400 corrects a single bit error in the main data MD or adjacent two bit errors in the main data MD, which occur in adjacent two memory cells based on the syndrome SDR, the parity check matrix HS and the sub parity check matrix SHS (S190).

Therefore, the error correction circuit and the semiconductor memory device including the error correction circuit may correct the single bit error and the adjacent two bit errors by using the parity check matrix which is based on the first ECC ECC1, may gather a mis-corrected bit and multiple error bits in one symbol or may render a column vector corresponding to the mis-corrected bit does not belong to the parity check matrix. Therefore, the error correction circuit and the semiconductor memory device including the error correction circuit may increase efficiency of error correcting and may enhance performance.

Figure 23:
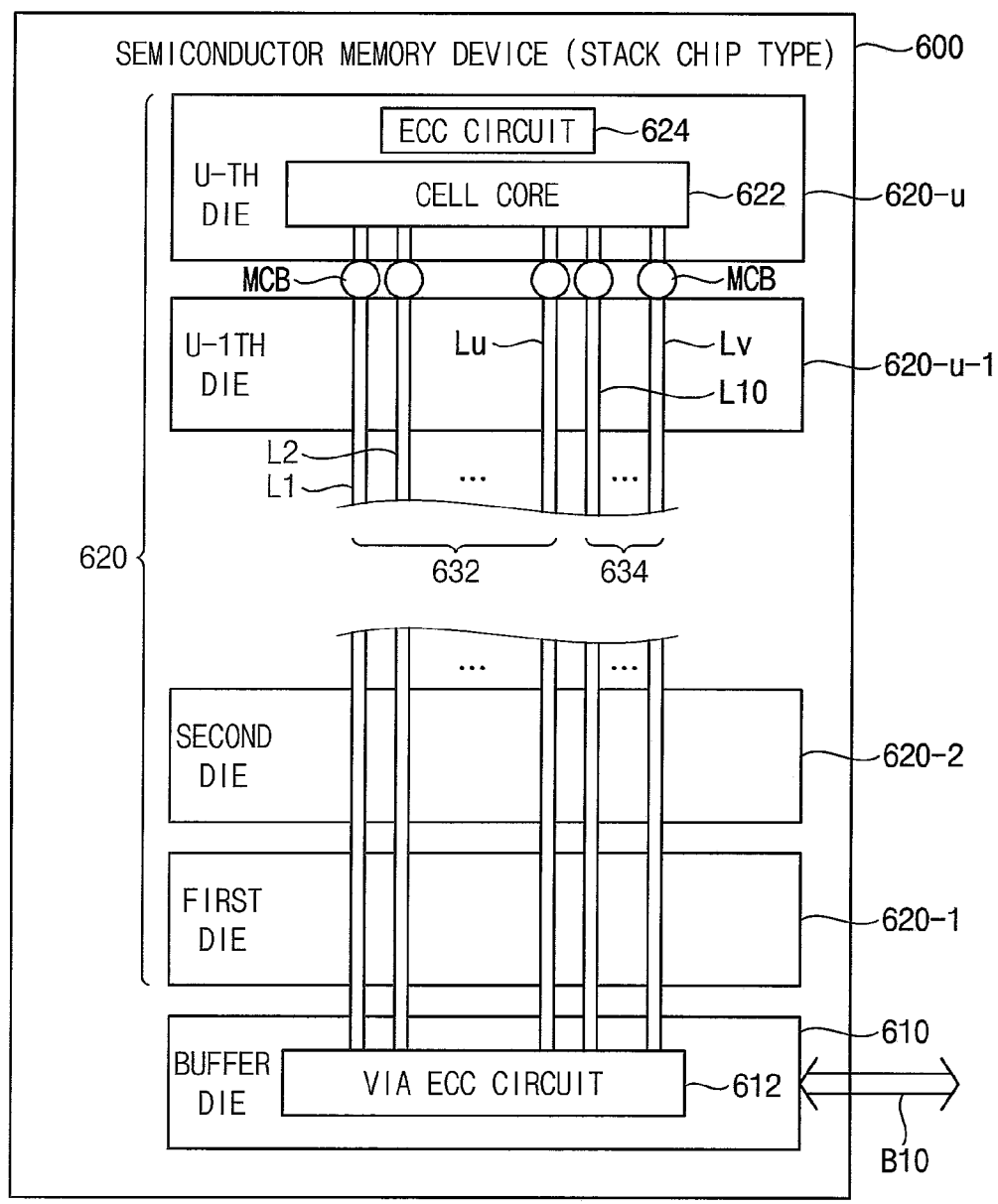
FIG. 23 is a block diagram illustrating a semiconductor memory device according to some example embodiments.

FIG. 23 is a block diagram illustrating a semiconductor memory device according to some example embodiments.

Referring to FIG. 23, a semiconductor memory device 600 may include a buffer die (or a logic die) 610 and a group of dies 620 providing a soft error analyzing and correcting function in a stacked chip structure.

The group of dies 620 may include a plurality of memory dies 620-1 to 620-$u$ ($u$ is a natural number greater than two) which is stacked on the buffer die 610 and convey data through a plurality of through substrate via (or, through silicon via (TSV)) lines. Through substrate vias (TSVs) may fully extend through the entire die in which it is formed or may only partially penetrate the die through the substrate of the die to form a via (electrical) connection from the backside of the die to the upper surface of the substrate (corresponding to the active surface side of the die) on which the integrated circuit is formed. When a TSV is formed in a die formed with a silicon substrate, the TSV may be referred to as a through silicon via.

Each of the memory dies 620-1 to 620$u$ may include a cell core 622 and an ECC circuit 624 and the cell core 622 may include a memory cell array including a plurality of sub array blocks arranged in a first direction and a second direction.

The ECC circuit 624 may be referred to as an error correction circuit and may employ the error correction circuit 400 of FIG. 11.

Therefore, the ECC circuit 624 may generate a syndrome and a sub parity check matrix based on a parity check matrix, may correct a single bit error and adjacent two bit errors based on the syndrome, the parity check matrix and the sub parity check matrix and may gather a mis-corrected bit and multiple error bits in one symbol or may render a column vector corresponding to the mis-corrected bit does not belong to an ECC. Therefore, the ECC circuit 624 may increase efficiency of error correcting to enhance performance of the semiconductor memory device 600.

The buffer die 610 may include an via ECC circuit 612 which corrects a transmission error using the transmission parity bits when a transmission error is detected from the transmission data received through the TSV lines and generate error-corrected data. The via ECC circuit 612 may be referred to as a via error correction circuit.

The semiconductor memory device 600 may be a stack chip type memory device or a stacked memory device which conveys data and control signals through the TSV lines. The TSV lines may also be called through electrodes.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 632 which is formed at one memory die 620-u may include 128 TSV lines L1 to Lu, and a parity TSV line group 634 may include TSV lines L10 to Lv.

The TSV lines L1 to Lu of the data TSV line group 632 and the parity TSV lines L10 to Lv of the parity TSV line group 634 may be connected to micro bumps MCB which are correspondingly formed among the memory dies 620-1 to 620-u.

Each of the memory dies 620-1 to 620-u may include DRAM cells each including at least one access transistor and one storage capacitor.

The semiconductor memory device 600 may have a three-dimensional (3D) chip structure or a 2.5D chip structure to communicate with a memory controller through a data bus B10. The buffer die 610 may be connected to the memory controller through the data bus B10.

The via ECC circuit 612 may determine whether a transmission error occurs at the transmission data received through the data TSV line group 632, based on the transmission parity bits received through the parity TSV line group 634.

When a transmission error is detected, the via ECC circuit 612 may correct the transmission error on the transmission data using the transmission parity bits. When the transmission error is uncorrectable, the via ECC circuit 612 may output information indicating occurrence of an uncorrectable data error.

Figure 24:
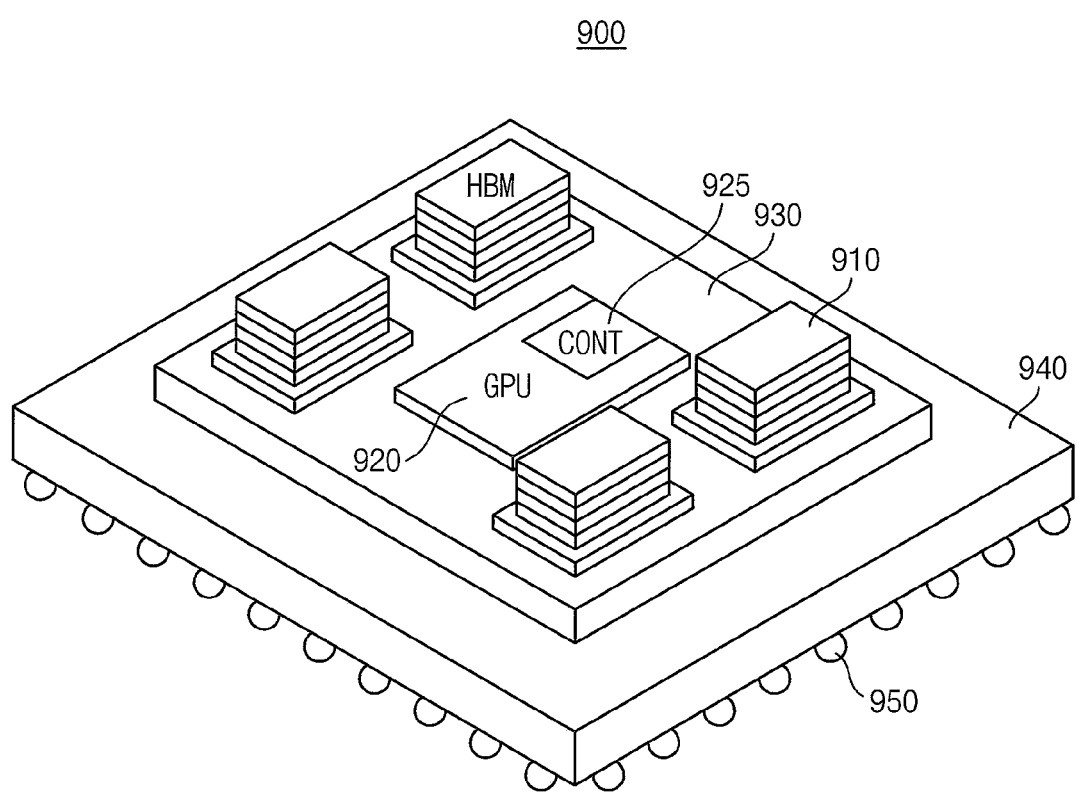
FIG. 24 is a diagram illustrating a semiconductor package including the stacked memory device according to some example embodiments.

FIG. 24 is a diagram illustrating a semiconductor package including the stacked memory device according to some example embodiments.

Referring to FIG. 24, a semiconductor package 900 may include one or more stacked memory devices 910 and a GPU 920 (graphic processing unit) and the GPU 920 includes a memory controller 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. Each of the stacked memory devices 910 may employ the semiconductor memory device 200 in FIG. 1. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, and each of the plurality of memory dies may include a memory cell array and an error correction circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the error correction circuit and the semiconductor memory device including the error correction circuit may generate a syndrome and a sub parity check matrix based on a parity check matrix, may correct a single bit error and adjacent two bit errors based on the syndrome, the parity check matrix and the sub parity check matrix and may gather a mis-corrected bit and multiple error bits in one symbol or may render a column vector corresponding to the mis-corrected bit does not belong to an ECC. Therefore, the error correction circuit may increase efficiency of error correcting and thus may enhance performance of the semiconductor memory device.

Example embodiments of the present disclosure may be applied to semiconductor memory devices and memory systems employing the ECC described herein.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. An error correction circuit of a semiconductor memory device, comprising:
   an error correction code (ECC) encoder configured to:
   generate, based on a first main data obtained by selectively shifting data bits of a main data based on a least significant bit (LSB) of a row address, a parity data using an ECC represented by a generation matrix, and
   store a codeword including the main data and the parity data in a target page of a memory cell array; and
   an ECC decoder configured to:
   read the main data and the parity data from the target page,
   generate a syndrome based on a second main data obtained by selectively shifting data bits of the main data based on the LSB of the row address, the parity data and a parity check matrix based on the ECC, and
   correct a single bit error when the single bit error exists in the main data or to correct two bit errors when the two bit errors occur in adjacent two memory cells in the target page based on the syndrome, wherein data bits of the main data are divided into a plurality of sub data units, wherein the ECC includes a plurality of column vectors divided into a plurality of code groups corresponding to respective ones of the plurality of sub data units, wherein the plurality of column vectors have elements configured to gather a mis-corrected bit and multiple error bits in one symbol, and wherein the mis-corrected bit is generated when the multiple error bits are present in the main data.

2. The error correction circuit of claim 1, wherein the one symbol includes two adjacent sub data units of the plurality of sub data units, and wherein the plurality of column vectors have elements configured to place the mis-corrected bit in sub data units corresponding to the one symbol or have elements such that a column vector corresponding to the mis-corrected bit is not the same as each of the plurality of column vectors.

3. The error correction circuit of claim 2, wherein the multiple error bits include two error bits or three or more error bits which are not adjacent to each other and are present in the one symbol.

4. The error correction circuit of claim 1, further comprising:
a first cyclic shifter configured to generate the first main data by cyclic-shifting the data bits of the main data in a first direction in response to the LSB of the row address having a high level to provide the first main data to the ECC encoder;
a second cyclic shifter configured to generate the second main data by cyclic-shifting the data bits of the read main data in the first direction in response to the LSB of the row address having a high level to provide the second main data to the ECC decoder; and
a cyclic de-shifter configured to cyclic-shift an output data of the ECC decoder in a second direction opposite to the first direction in response to the LSB of the row address having a high level.

5. The error correction circuit of claim 1, wherein the ECC decoder is configured to:
correct the single bit error in the main data based on a parity check matrix, and
correct the two bit errors in the main data based on a sub parity check matrix generated based on the parity check matrix.

6. The error correction circuit of claim 5, wherein the parity check matrix includes a plurality of column vectors divided into a plurality of code groups corresponding to the plurality of sub data units and the parity data.

7. The error correction circuit of claim 6, wherein the ECC decoder is configured to generate the sub parity check matrix by performing an exclusive OR operation on a $(2i-1)$-th column vector and a $(2i)$-th column vector adjacent to the $(2i-1)$-th column vector of the plurality of column vectors, i being one of 1 to k, k being a number of data bits in each of the plurality of sub data units.

8. The error correction circuit of claim 5, wherein the ECC decoder includes:
a syndrome generation circuit configured to generate the syndrome and the sub parity check matrix based on the parity check matrix, the second main data and the parity data;
a syndrome decoding circuit configured to generate a first error decoding signal associated with the single bit error, a second error decoding signal associated with the two bit errors and a selection signal by decoding the syndrome based on the parity check matrix and the sub parity check matrix;
a first corrector configured to correct the single bit error in the second main data based on the first error decoding signal to provide a first corrected data;
a second corrector configured to correct the two bit errors in the second main data based on the second error decoding signal to provide a second corrected data; and
a selection circuit configured to select one of the second main data, the first corrected data and the second corrected data in response to the selection signal to provide the selected one as an output data of the ECC decoder.

9. The error correction circuit of claim 8, wherein the syndrome generation circuit includes:
a syndrome generator configured to generate the syndrome by applying the parity check matrix to the second main data and the parity data; and
a sub check matrix generator configured to generate the sub parity check matrix based on a first portion of the parity check matrix by performing an exclusive OR operation on a $(2i-1)$-th column vector and a $(2i)$-th column vector adjacent to the $(2i-1)$-th column vector of the plurality of column vectors, i being one of 1 to k, k being a number of data bits in each of the plurality of sub data units.

10. The error correction circuit of claim 9, wherein the syndrome decoding circuit includes:
a syndrome decoder configured to compare the syndrome to the parity check matrix and the sub parity check matrix to generate the first error decoding signal and the second error decoding signal based on a result of the comparison; and
a selection signal generator configured to generate the selection signal based on the first error decoding signal and the second error decoding signal.

11. The error correction circuit of claim 10, wherein when the syndrome matches one of the plurality of column vectors of the parity check matrix, the syndrome decoder is configured to indicate a position of the single bit error with the first error decoding signal.

12. The error correction circuit of claim 10, wherein when the syndrome matches one of the plurality of column vectors of the sub parity check matrix, the syndrome decoder is configured to indicate positions of the two bit errors with the second error decoding signal.

13. A semiconductor memory device, comprising:
a memory cell array including a plurality of volatile memory cells connected to word-lines and bit-lines; and
an error correction circuit configured to:
generate a parity data based on a main data and an error correction code (ECC),
store a codeword including the main data and the parity data in a target page of the memory cell array based on an access address receiving from an external device,
read the codeword from the target page,
generate a syndrome based on a parity check matrix based on the ECC, and
correct a single bit error when the single bit error exists in the main data or to correct two bit errors when the two bit errors occur in adjacent two memory cells of the target page based on the syndrome,
wherein data bits of the main data are divided into a plurality of sub data units, wherein the ECC includes a plurality of column vectors divided into a plurality of code groups corresponding to respective ones of the plurality of sub data units, wherein the plurality of column vectors have elements configured to gather a mis-corrected bit and multiple error bits in one symbol, and wherein the mis-corrected bit is generated when the multiple error bits are present in the main data.

14. The semiconductor memory device of claim 13, wherein the error correction circuit includes:
an ECC encoder configured to generate, based on a first main data obtained by selectively shifting data bits of a main data based on a least significant bit (LSB) of a row address of the access address, the parity data using the ECC; and
an ECC decoder configured to:
read the main data and the parity data from the target page,
generate the syndrome based on a second main data obtained by selectively shifting data bits of the main data based on the LSB of the row address, the parity data and the parity check matrix, and
correct the single bit error or the two bit errors based on the syndrome.

15. The semiconductor memory device of claim 14, wherein:
the one symbol includes two adjacent sub data units of the plurality of sub data units,
the two adjacent sub data units include data bits read from two sub array regions sharing one sub word-line driver region, and
the plurality of column vectors have elements configured to place the mis-corrected bit in sub data units corresponding to the one symbol or have elements such that a column vector corresponding to the mis-corrected bit is not the same as each of the plurality of column vectors.

16. The semiconductor memory device of claim 14, wherein the error correction circuit further includes:
a first cyclic shifter configured to generate the first main data by cyclic-shifting the data bits of the main data in a first direction in response to the LSB of the row address having a high level to provide the first main data to the ECC encoder;
a second cyclic shifter configured to generate the second main data by cyclic-shifting the data bits of the read main data in the first direction in response to the LSB of the row address having a high level to provide the second main data to the ECC decoder; and
a cyclic de-shifter configured to cyclic-shift an output data of the ECC decoder in a second direction opposite to the first direction in response to the LSB of the row address having a high level.

17. The semiconductor memory device of claim 14, wherein:
the parity check matrix includes a plurality of column vectors divided into a plurality of code groups corresponding to the plurality of sub data units and the parity data, and
the ECC decoder is configured to generate a sub parity check matrix by performing an exclusive OR operation on a (2i−1)-th column vector and a (2i)-th column vector adjacent to the (2i−1)-th column vector of the plurality of column vectors, i being one of 1 to k, k being a number of data bits in each of the plurality of sub data units.

18. The semiconductor memory device of claim 14, wherein the ECC decoder includes:
a syndrome generation circuit configured to generate the syndrome and a sub parity check matrix generated based on the parity check matrix, the second main data and the parity data;
a syndrome decoding circuit configured to generate a first error decoding signal associated with the single bit error, a second error decoding signal associated with the two bit errors and a selection signal by decoding the syndrome based on the parity check matrix and the sub parity check matrix;
a first corrector configured to correct the single bit error in the second main data based on the first error decoding signal to provide a first corrected data;
a second corrector configured to correct the two bit errors in the second main data based on the second error decoding signal to provide a second corrected data; and
a selection circuit configured to select one of the second main data, the first corrected data and the second corrected data in response to the selection signal to provide the selected one as an output data of the ECC decoder.

19. The semiconductor memory device of claim 13, further comprising:
a buffer die; and
a plurality of memory dies stacked on the buffer die and configured to convey data through a plurality of through substrate via (TSV) lines,
wherein at least one of the plurality of memory dies includes the memory cell array and the error correction circuit.

20. A semiconductor memory device, comprising:
a memory cell array including a plurality of volatile memory cells connected to word-lines and bit-lines;
an error correction circuit configured to:
generate a parity data based on a main data and an error correction code (ECC),
store a codeword including the main data and the parity data in a target page of the memory cell array based on an access address receiving from an external device,
read the codeword from the target page,
generate a syndrome based on a parity check matrix based on the ECC, and
correct a single bit error when the single bit error exists in the main data or to correct two bit errors when the two bit errors occur in adjacent two memory cells in the target page based on the syndrome; and
a control logic circuit configured to control the error correction circuit based on the access address and a command receiving from the external device,
wherein the error correction circuit includes:
an ECC encoder configured to generate, based on a first main data obtained by selectively shifting data bits of the main data based on a least significant bit (LSB) of a row address of the access address, the parity data using the ECC; and
an ECC decoder configured to:
read the main data and the parity data from the target page,
generate the syndrome based on a second main data obtained by selectively shifting data bits of the main data based on the LSB of the row address, the parity data and the parity check matrix, and
correct the single bit error or the two bit errors based on the syndrome, wherein the data bits are divided into a plurality of sub data units, wherein the ECC includes a plurality of column vectors divided into a plurality of code groups corresponding to respective ones of the plurality of sub data units, wherein the plurality of column vectors have elements configured to gather a mis-corrected bit and multiple error bits in one symbol, and wherein the mis-corrected bit is generated when the multiple error bits are present in the main data.

* * * * *